(12) United States Patent  
Gopman et al.

(10) Patent No.: US 9,952,293 B2
(45) Date of Patent: Apr. 24, 2018

(54) MAGNETIC PIEZOELECTRIC COMPOSITE, SENSOR, AND MEMORY

(71) Applicant: GOVERNMENT OF THE UNITED STATES, AS REPRESENTED BY THE SECRETARY OF COMMERCE, Washington, DC (US)

(72) Inventors: Daniel B. Gopman, Bethesda, MD (US); Robert D. Shull, Boyds, MD (US)

(73) Assignee: THE UNITED STATES OF AMERICA, AS REPRESENTED BY THE SECRETARY OF COMMERCE, Washington, DC (US)

( * ) Notice: Subject to any disclaimer, the term of this patent is extended or adjusted under 35 U.S.C. 154(b) by 0 days.

(21) Appl. No.: 15/395,454

(22) Filed: Dec. 30, 2016

(65) Prior Publication Data

US 2017/0236993 A1    Aug. 17, 2017

Related U.S. Application Data

(60) Provisional application No. 62/275,840, filed on Jan. 7, 2016.

(51) Int. Cl.
| | |
|---|---|
| *H01L 41/08* | (2006.01) |
| *G01R 33/09* | (2006.01) |
| *G11C 11/16* | (2006.01) |
| *H01L 43/08* | (2006.01) |
| *H01L 41/09* | (2006.01) |

(52) U.S. Cl.
CPC .......... *G01R 33/093* (2013.01); *G01R 33/098* (2013.01); *G11C 11/161* (2013.01); *H01L 43/08* (2013.01); *H01L 41/0986* (2013.01)

(58) Field of Classification Search
CPC ....... H01L 41/1132; H01L 41/09; H01L 41/18
USPC .......................................................... 310/338
See application file for complete search history.

(56) References Cited

U.S. PATENT DOCUMENTS 8,860,006 B2    10/2014    Wang et al.

OTHER PUBLICATIONS

US 8,921,862, 12/2014, Atulasimha et al. (withdrawn)
Wu, T., et al., Electrical control of reversible and permanent magnetization reorientation for magnetoelectic memory devices, Applied Physics Letters, 2011, 262504, 98.
Hu, Z., et al., Voltage control of magnetism in FeGaB/PIN-PMN-PT multiferroic heterostructures for high-power and high-temperature applications, Applied Physics Letters, 2015, 022901, 106.
Lee, J-W., et al., Spin engineering of CoPd alloy films via the inverse piezoelectric effect, Applied Physics Letters, 2003, 82(15).

(Continued)

*Primary Examiner* — Derek Rosenau
(74) *Attorney, Agent, or Firm* — Toby D. Hain

(57) ABSTRACT

A magnetic piezoelectric composite adjusts magnetic anisotropy strength in a bimetallic member and includes: a piezoelectric layer to produce a strain in response to receipt of a strain voltage; and the bimetallic member disposed on the piezoelectric layer, the bimetallic member including: a plurality of metal layers, such that a second metal layer is interposed between a pair of first metal layers, the bimetallic member being ferromagnetic; and a magnetic anisotropy strength that changes in response to receipt of the strain from the piezoelectric layer.

23 Claims, 29 Drawing Sheets

(56) References Cited

OTHER PUBLICATIONS

Lei, N., et al., Magnetization reversal assisted by the inverse piezoelectric effect in Co—Fe—B/ferroelectric multilayers, Physical Review B, 2011, 012404, 84.
Yang, Y.T., et al., Electric field control of magnetic properties in CoPt/Pb(Mg1/3Nb2/3)O3—PbTiO3 heterostructure a room temperature, Applied Physics Letters, 2013, 082404, 103.
Shepley, P.M., et al., Modification of perpendicular magnetic anisotropy and domain wall velocity in Pt/Co/Pt by voltage-induced strain, Scientific Reports, 2015.

MAGNETIC PIEZOELECTRIC COMPOSITE, SENSOR, AND MEMORY

CROSS REFERENCE TO RELATED APPLICATIONS

This application claims the benefit of U.S. Provisional Patent Application Ser. No. 62/275,840, filed Jan. 7, 2016, the disclosure of which is incorporated herein by reference in its entirety.

STATEMENT REGARDING FEDERALLY SPONSORED RESEARCH

This invention was made with United States Government support from the National Institute of Standards and Technology. The Government has certain rights in the invention.

BRIEF DESCRIPTION

Disclosed is a magnetic piezoelectric composite to adjust magnetic anisotropy strength in a bimetallic member, the magnetic piezoelectric composite comprising: a piezoelectric layer to produce a strain in response to receipt of a strain voltage; and the bimetallic member disposed on the piezoelectric layer, the bimetallic member comprising: a plurality of metal layers, such that a second metal layer is interposed between a pair of first metal layers, the bimetallic member being ferromagnetic; and a magnetic anisotropy strength that changes in response to receipt of the strain from the piezoelectric layer.

Further disclosed is a magnetic piezoelectric sensor comprising: a piezoelectric layer comprising: a strain surface; and a basal surface, the piezoelectric layer to produce a strain in response to receipt of a strain voltage; a first bimetallic member disposed on the strain surface of the piezoelectric layer to receive the strain from the piezoelectric layer, the first bimetallic member comprising: a plurality of metal layers, such that a second metal layer is interposed between a pair of first metal layers, the first bimetallic member being ferromagnetic; and a first magnetic anisotropy strength that changes in response to receipt of the strain from the piezoelectric layer; a second bimetallic member disposed on first bimetallic member to receive a second strain, the second bimetallic member comprising: a second plurality of metal layers, such that a fourth metal layer is interposed between a pair of third metal layers, the second bimetallic member being ferromagnetic; and a second magnetic anisotropy strength that remains static; a second anisotropy tuning layer interposed between the first bimetallic member and the second bimetallic member, the second anisotropy tuning layer to electrically insulate the first bimetallic member from the second bimetallic member; an anti-ferromagnetic pinning member to fix the magnetization direction of second bimetallic member such that second bimetallic member is disposed between second anisotropy tuning layer and anti-ferromagnetic pinning member; a first electrically conductive layer on which the strain surface of the piezoelectric layer is disposed, such that the piezoelectric layer is interposed between the first electrically conductive layer and the first bimetallic member, wherein the first electrically conductive layer selectively adjusts the magnetic anisotropy strength of the first bimetallic member.

Also disclosed is a magnetic piezoelectric memory comprising: a piezoelectric layer comprising: a strain surface; and a basal surface, the piezoelectric layer to produce a first strain in response to receipt of a first strain voltage; a first bimetallic member disposed on the strain surface of the piezoelectric layer to receive the first strain from the piezoelectric layer, the first bimetallic member comprising: a first plurality of metal layers, such that a second metal layer is interposed between a pair of first metal layers; and a first magnetic anisotropy strength that changes in response to receipt of the first strain from the piezoelectric layer, the first bimetallic member being ferromagnetic; a second bimetallic member disposed on first bimetallic member to receive a second strain, the second bimetallic member comprising: a second plurality of metal layers, such that a fourth metal layer is interposed between a pair of third metal layers, the second bimetallic member being ferromagnetic; and a second magnetic anisotropy strength that remains static; a second anisotropy tuning layer interposed between the first bimetallic member and the second bimetallic member, the second anisotropy tuning layer to electrically insulate the first bimetallic member from the second bimetallic member; an anti-ferromagnetic pinning member to fix the magnetization direction of second bimetallic member such that second bimetallic member is disposed between second anisotropy tuning layer and anti-ferromagnetic pinning member; and a first electrically conductive layer on which the strain surface of the piezoelectric layer is disposed, such that the piezoelectric layer is interposed between the first electrically conductive layer and the first bimetallic member, such that the first electrically conductive layer selectively adjusts the first magnetic anisotropy strength of the first bimetallic member.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

It has been discovered that a magnetic piezoelectric composite that includes a bimetallic member (e.g., cobalt-nickel bimetallic member) disposed on a piezoelectric layer (e.g., PZT) provides a magnetic anisotropy strength that is reversibly adjustable in a presence of a strain voltage applied to piezoelectric layer. Beneficially and unexpectedly, the magnetic piezoelectric composite is included in articles (e.g., a magnetic piezoelectric memory or a magnetic piezoelectric sensor) that provide memory storage and reading as well as sensing a strength of an externally applied magnetic field.

Figure 1:
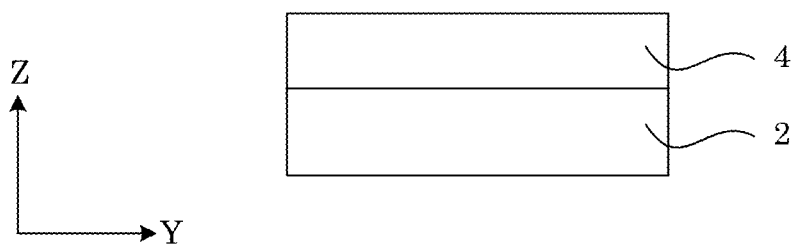
FIG. 1 shows a cross-sectional view of a magnetic piezoelectric composite.

In an embodiment, with reference to FIG. 1, magnetic piezoelectric composite 100 includes bimetallic member 4 disposed on piezoelectric layer 2. Here, magnetic piezoelectric composite 100 adjusts a magnetic anisotropy strength in bimetallic member 4, wherein piezoelectric layer 2 produces a strain in response to receipt of a strain voltage. Further, bimetallic member 4 includes a plurality of metal layers (e.g., see FIG. 16) and a magnetic anisotropy strength that changes in response to receipt of the strain from piezoelectric layer 2. In the plurality of metal layers of bimetallic member 4, a second metal layer is interposed between a pair of first metal layers.

Figure 2:
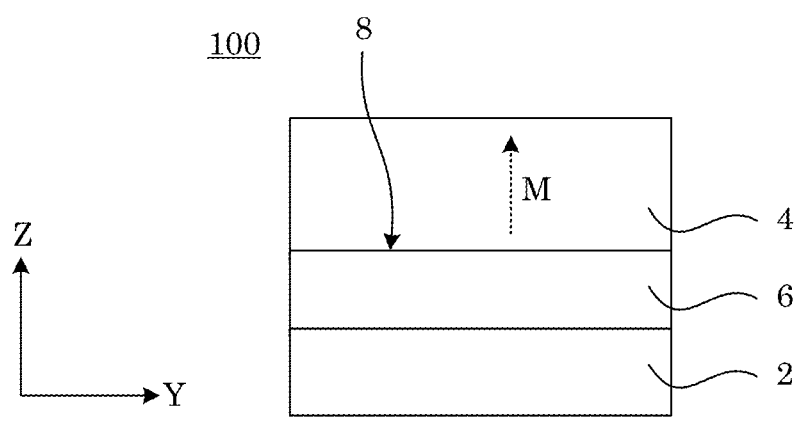
FIG. 2 shows a cross-sectional view of a magnetic piezoelectric composite.

In an embodiment, with reference to FIG. 2, magnetic piezoelectric composite 100 includes first anisotropy tuning layer 6 interposed between piezoelectric layer 2 and bimetallic member 4. Here, first anisotropy tuning layer 6 provides a spatial preference of magnetization M of bimetallic member 4 in which magnetization M is perpendicular to interface 8 (i.e., along direction Z in FIG. 2) between first anisotropy tuning layer 6 and bimetallic member 4 in an absence of the strain from piezoelectric layer 2.

Figure 3:
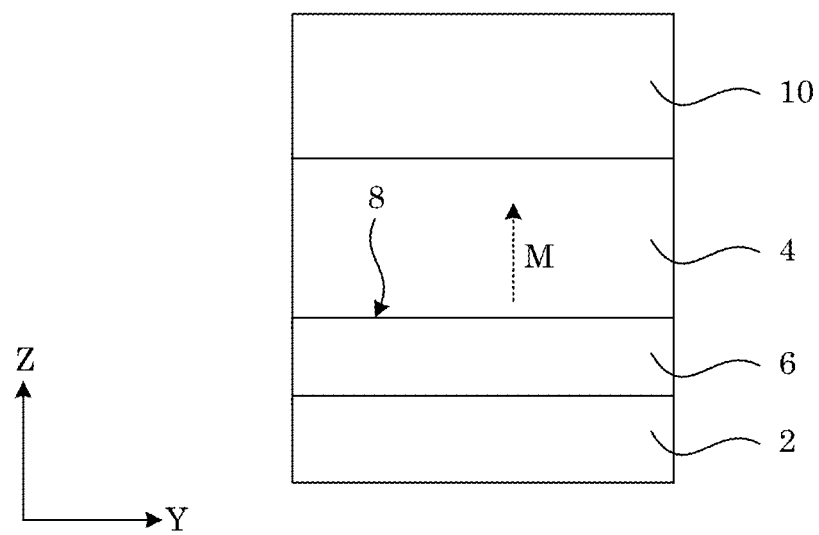
FIG. 3 shows a cross-sectional view of a magnetic piezoelectric composite.

In an embodiment, with reference to FIG. 3, magnetic piezoelectric composite 100 includes second anisotropy tuning layer 10 disposed on bimetallic member 4, wherein second anisotropy tuning layer 10, in combination with first anisotropy tuning layer 6, provides the spatial preference (along direction Z) of magnetization M of bimetallic member 4 perpendicular to interface 8 between first anisotropy tuning layer 6 and bimetallic member 4 in the absence of the strain from piezoelectric layer 2.

Figure 4:
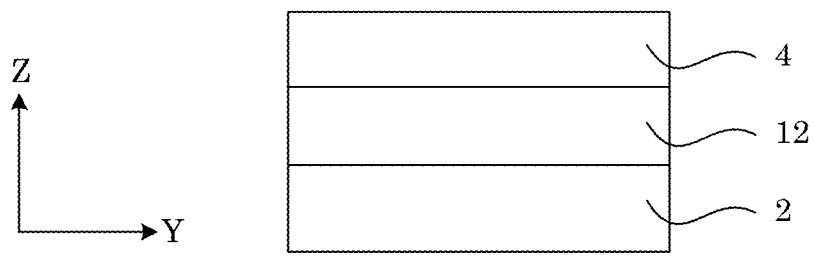
FIG. 4 shows a cross-sectional view of a magnetic piezoelectric composite.
Figure 5:
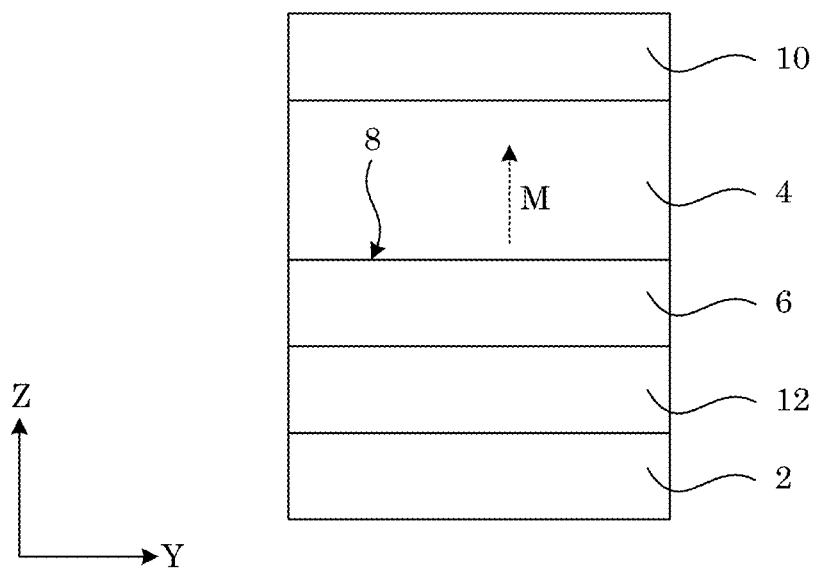
FIG. 5 shows a cross-sectional view of a magnetic piezoelectric composite.

According to an embodiment, with reference to FIG. 4, magnetic piezoelectric composite 100 includes adhesion layer 12 interposed between piezoelectric layer 2 and bimetallic member 4. In some embodiments, as shown in FIG. 5, magnetic piezoelectric composite 100 includes first anisotropy tuning layer 6 disposed on adhesion layer 12 and second anisotropy tuning layer 10 disposed on bimetallic member 4.

Figure 6:
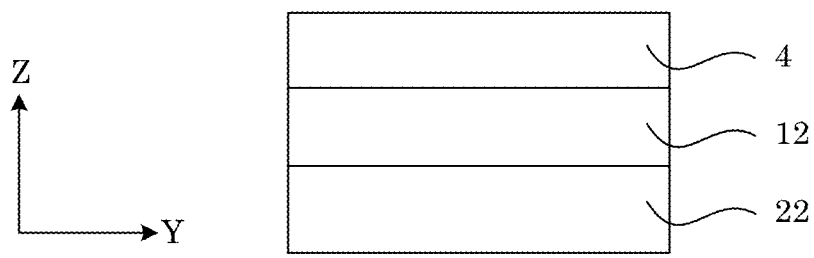
FIG. 6 shows a cross-sectional view of a magnetic piezoelectric composite.

In an embodiment, with reference to FIG. 6, piezoelectric layer 2 and bimetallic member 4 are disposed on substrate 22. Substrate 22 can be proximate to piezoelectric layer 2 and distal to bimetallic member 4 as in FIG. 6 or can be proximate to bimetallic member 4 and distal to piezoelectric layer 2 (not shown). Moreover, substrate 22 can be disposed on external surfaces of both piezoelectric layer 2 and bimetallic member 4.

Figure 7:
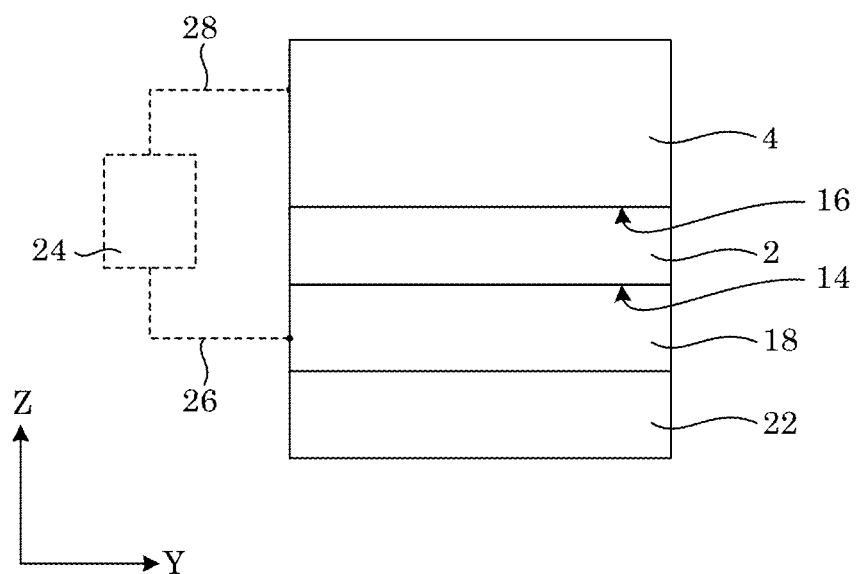
FIG. 7 shows a cross-sectional view of a magnetic piezoelectric sensor.

It is contemplated that magnetic piezoelectric composite 100 can be included in various articles such as a magnetic piezoelectric sensor or a magnetic piezoelectric memory. In an embodiment, magnetic piezoelectric sensor 102, with reference to FIG. 7, includes piezoelectric layer 2 that includes strain surface 16 and basal surface 14, wherein piezoelectric layer 2 produces the strain in response to receipt of the strain voltage. Magnetic piezoelectric sensor 102 also includes bimetallic member 4 disposed on strain surface 16 of piezoelectric layer 2 that receives the strain from piezoelectric layer 2. Bimetallic member 4 includes a plurality of metal layers, such that a second metal layer is interposed between a pair of first metal layers, and the magnetic anisotropy strength of the bimetallic member 4 changes in response to receipt of the strain from piezoelectric layer 2. First electrically conductive layer 18 on which basal surface of piezoelectric layer 2 is disposed, such that piezoelectric layer 2 is interposed between first electrically conductive layer 18 and bimetallic member 4, wherein first electrically conductive layer 18 selectively adjusts the magnetic anisotropy strength of bimetallic member 4.

Power source 24 can be electrically connected to first electrically conductive layer 18 via electrical communication line 26 and to bimetallic member 4 via electrical communication line 28. In this manner, power source 24 can provide electrical current through bimetallic member 4 to bias piezoelectric layer 2 with the voltage to produce electric field between bimetallic member 4 and electrically conductive layer 18.

Figure 8:
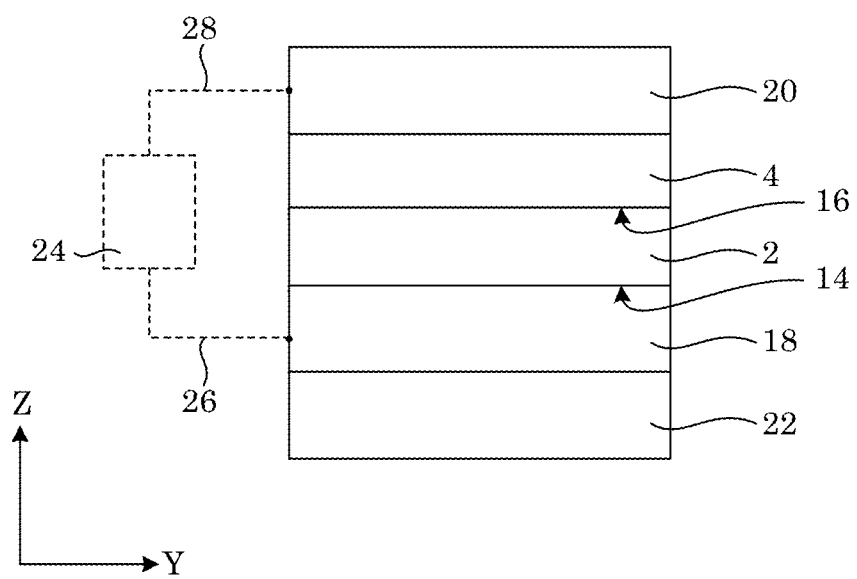
FIG. 8 shows a cross-sectional view of a magnetic piezoelectric sensor.

In an embodiment, with reference to FIG. 8, magnetic piezoelectric sensor 102 includes second electrically conductive layer 20 disposed on bimetallic member 4 distal to piezoelectric layer 2 relative to bimetallic member 4, such that bimetallic member 4 is interposed between piezoelectric layer 2 and second electrically conductive layer 20. Second electrically conductive layer 20, in combination with first electrically conductive layer 18, selectively adjusts the magnetic anisotropy strength of bimetallic member 4. Here, power source 24 can be electrically connected to first electrically conductive layer 18 and second electrically conductive layer 20 to provide the potential to these layers and an electric field across piezoelectric layer 2.

Figure 9:
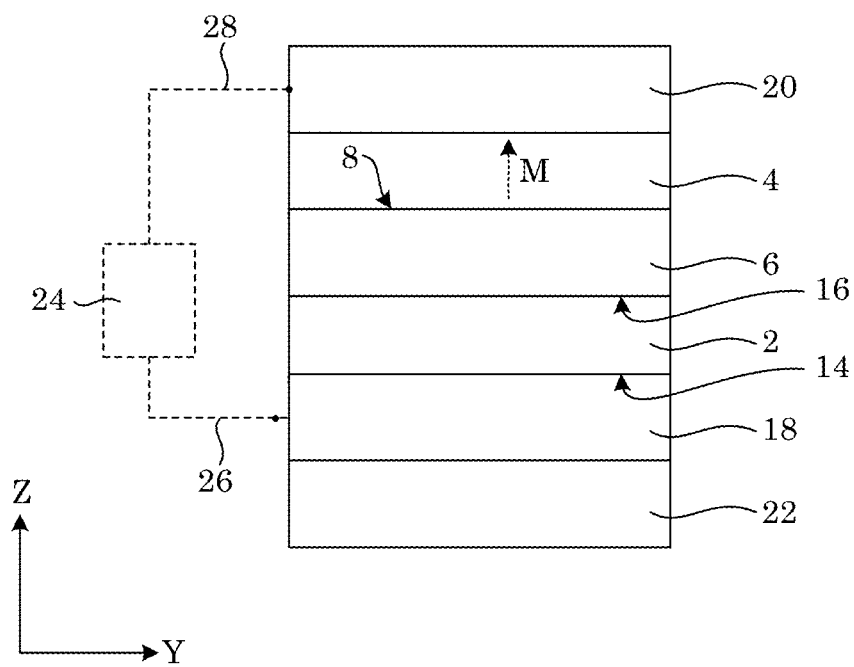
FIG. 9 shows a cross-sectional view of a magnetic piezoelectric sensor.

In an embodiment, with reference to FIG. 9, magnetic piezoelectric sensor 102 includes first anisotropy tuning layer 6 interposed between piezoelectric layer 2 and bimetallic member 4. Here, first anisotropy tuning layer 6 provides a spatial preference of magnetization M of bimetallic member 4 in which magnetization M is perpendicular to interface 8 (i.e., along direction Z in FIG. 2) between first anisotropy tuning layer 6 and bimetallic member 4 in an absence of the strain from piezoelectric layer 2.

Figure 10:
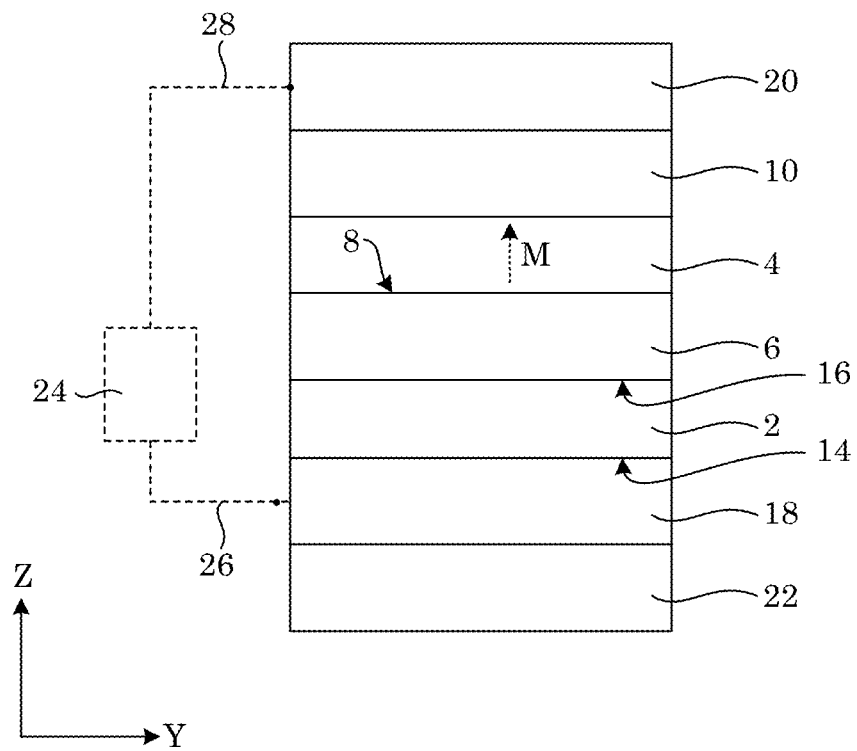
FIG. 10 shows a cross-sectional view of a magnetic piezoelectric sensor.

In an embodiment, with reference to FIG. 10, magnetic piezoelectric sensor 102 includes second anisotropy tuning layer 10 disposed on bimetallic member 4, wherein second anisotropy tuning layer 10, in combination with first anisotropy tuning layer 6, provides the spatial preference (along direction Z) of magnetization M of bimetallic member 4 perpendicular to interface 8 between first anisotropy tuning layer 6 and bimetallic member 4 in the absence of the strain from piezoelectric layer 2.

Figure 11:
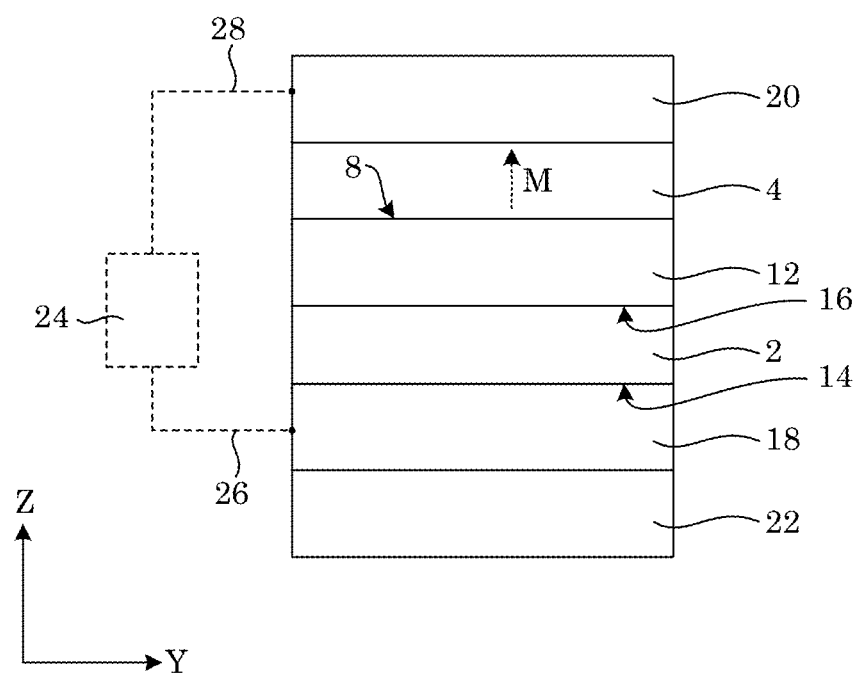
FIG. 11 shows a cross-sectional view of a magnetic piezoelectric sensor.
Figure 12:
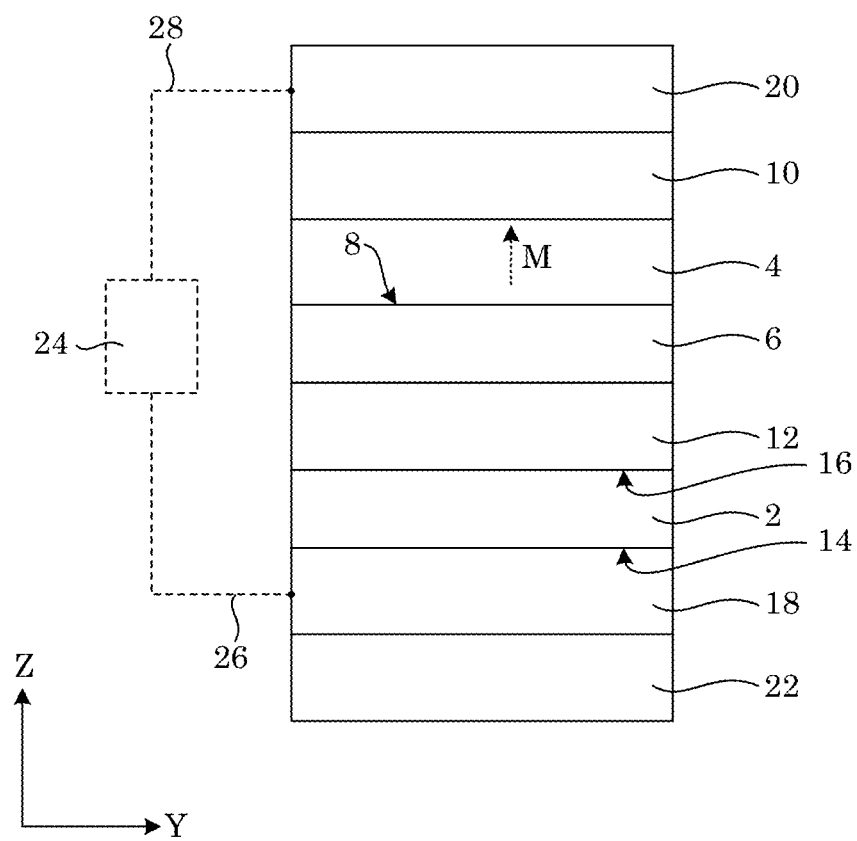
FIG. 12 shows a cross-sectional view of a magnetic piezoelectric sensor.

According to an embodiment, with reference to FIG. 11, magnetic piezoelectric sensor 102 includes adhesion layer 12 interposed between piezoelectric layer 2 and bimetallic member 4. In some embodiments, as shown in FIG. 12, magnetic piezoelectric sensor 102 includes first anisotropy tuning layer 6 disposed on adhesion layer 12 and second anisotropy tuning layer 10 disposed on bimetallic member 4.

Figure 13:
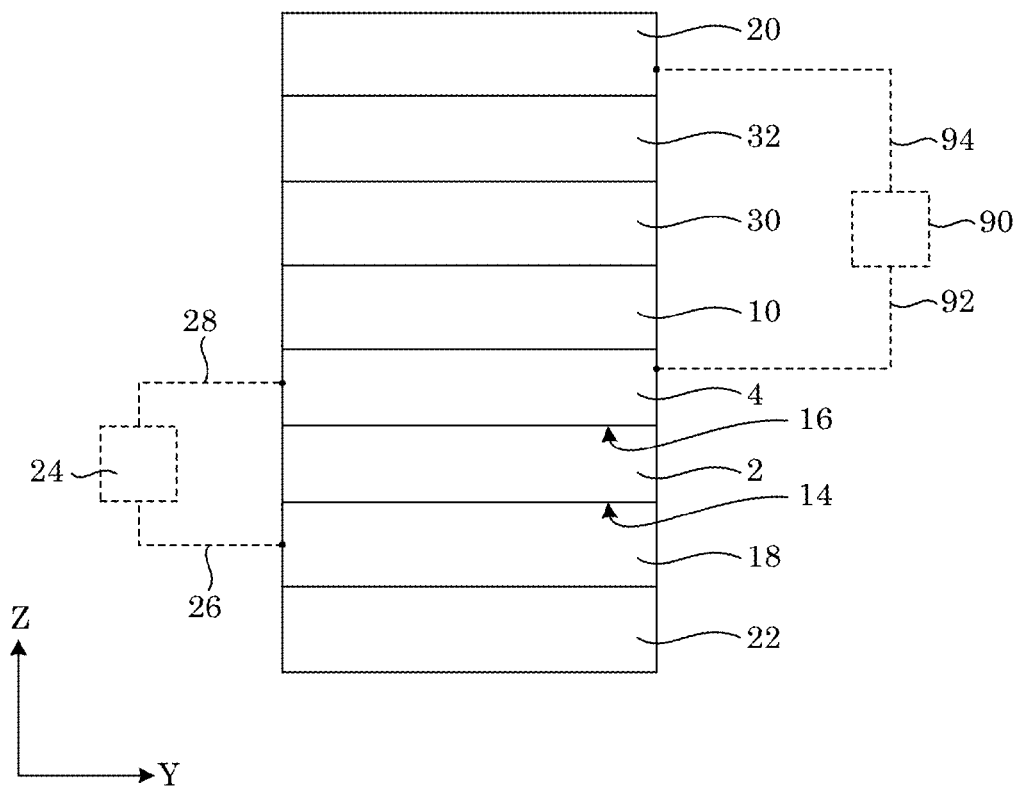
FIG. 13 shows a cross-sectional view of a magnetic piezoelectric memory.

In an embodiment, with reference to FIG. 13, magnetic piezoelectric sensor 102 includes piezoelectric layer 2 that includes strain surface 16 and basal surface 14, wherein piezoelectric layer 2 produces the strain in response to receipt of the strain voltage. magnetic piezoelectric sensor 102 also includes a first bimetallic member 4 disposed on strain surface 16 of piezoelectric layer 2 that receives the first strain from piezoelectric layer 2. First bimetallic member 4 includes a first plurality of metal layers, such that a second metal layer is interposed between a pair of first metal layers, and a first magnetic anisotropy strength of first bimetallic member 4 changes in response to receipt of the first strain from piezoelectric layer 2. Second bimetallic member 30 is disposed on first bimetallic member 4 wherein second bimetallic member 30 includes: a second plurality of metal layers, such that a fourth metal layer is interposed between a pair of third metal layers; and a second magnetic anisotropy strength that is static and provides the spatial preference (along Y direction) of magnetization M of second bimetallic member 30. Magnetization pinning layer 32 is interposed between second bimetallic member 30 and second electrically conductive layer 20 and pins the magnetization M of second bimetallic member 30 such that it provides the spatial preference (along +Y direction) of magnetization M of second bimetallic member 30.

Second power source 90 can be electrically connected to second electrically conductive layer 20 via electrical communication line 94 and to first bimetallic member 4 via electrical communication line 92. In this manner, second power source 90 can bias second anisotropy tuning layer 10 with a fixed potential difference to produce an electric field across second anisotropy tuning layer 10 for developing an electrical current that can be measured by second power source 90. In this manner, an electric current can be measured in response to the fixed potential difference across the second anisotropy tuning layer 10, whose magnitude is related to a spin dependent tunneling between the two ferromagnetic layers (first bimetallic member 4 and second bimetallic member 30) and depends upon the relative alignment angle between spin states of the two bimetallic members 30 and 4 (e.g. exhibits a tunneling magnetoresistance). Accordingly, a first magnetic spin state of first bimetallic member 4 is controlled by subjecting, from first power source 24, strain voltage V_strain to piezoelectric layer 2 that produces first strain on first bimetallic member 4. Similarly, a second magnetic spin state of second bimetallic member 30 is controlled by subjecting, from magnetization pinning layer 32, an exchange bias pinning (also referred to as the second strain) to second bimetallic member 30. In this manner, the magnetic spin state of second bimetallic member 30 is permanently fixed (spatial preference along +Y) and is referred to as a reference layer RL, and first bimetallic member 4 is referred to as a free layer FL. In an embodiment, the second magnetic spin state of reference layer RL (second bimetallic member 30) is selected to be oriented parallel with the positive-Y (+Y) direction shown in FIG. 13, and the first magnetic spin state of free layer FL (first bimetallic member 4) is selected to have an orientation that is perpendicular with respect to orientation of the second magnetic spin state of reference layer RL (second bimetallic member 30), based on the first strain from piezoelectric layer 2. As used herein, magnetic spin states are oriented parallel to one another when they point in the same direction in space, e.g., along a +Y- or −Y-direction. As used herein, magnetic spin states are oriented antiparallel to one another when the point in opposite directions (i.e., π radians) in space, e.g., a first magnetic spin state oriented along the +Y-direction, and a second magnetic spin state oriented along the −Y-direction. As used herein, magnetic spin states are oriented perpendicular to one another when they point at right-angles to one another (i.e., π/2 radians) in space, e.g., a first magnetic spin state oriented along the +Z-direction and a second magnetic spin state oriented along the +Y direction. In an embodiment, an external applied field along the Y axis can re-orient the magnetic spin state of the free layer FL such that it can be aligned parallel to the magnetic spin state of the RL, or anti-parallel to the magnetic spin state of the RL, or at an arbitrary angle with the RL between +π radians and −π radians. As the relative alignment of the two layers is adjusted, power source 90 can measure a spin-dependent tunneling current in proportion to the magnetic spin state of the free layer FL as second anisotropy tuning layer 10 is biased by power source 90.

Magnetic piezoelectric sensor 102 can be used to sense a magnetic field subjected to bimetallic member 4 of magnetic piezoelectric sensor 102. By including an additional bimetallic member, the magnetic piezoelectric memory can provide repeatedly writable magnetic memory storage.

In an embodiment, with reference to FIG. 13, magnetic piezoelectric memory 104 includes piezoelectric layer 2 that includes strain surface 16 and basal surface 14, wherein piezoelectric layer 2 produces the strain in response to receipt of the strain voltage. Magnetic piezoelectric memory 104 also includes first bimetallic member 4 disposed on strain surface 16 of piezoelectric layer 2 that receives the first strain from piezoelectric layer 2. First bimetallic member 4 includes a first plurality of metal layers, such that a second metal layer is interposed between a pair of first metal layers, and a first magnetic anisotropy strength of first bimetallic member 4 changes in response to receipt of the first strain from piezoelectric layer 2. Second bimetallic member 30 is disposed on first bimetallic member 4 and receives a second strain, wherein second bimetallic member 30 includes: a second plurality of metal layers, such that a fourth metal layer is interposed between a pair of third metal layers; and a second magnetic anisotropy strength static and provides the spatial preference (along Z direction) of magnetization M of second bimetallic member 30. Magnetization pinning layer 32 is interposed between second bimetallic member 30 and second electrically conductive layer 20 and pins the magnetization M of second bimetallic member 30 such that it provides the spatial preference (along +Z direction) of magnetization M of second bimetallic member 30.

Second anisotropy tuning layer 10 is interposed between first bimetallic member 4 and second bimetallic member 30 so that second anisotropy tuning layer 30 electrically insulates first bimetallic member 4 from second bimetallic member 30. Additionally, magnetic piezoelectric memory 104 includes first electrically conductive layer 18 on which basal surface 14 of piezoelectric layer 2 is disposed, such that piezoelectric layer 2 is interposed between first electrically conductive layer 18 and first bimetallic member 4. In this configuration, first electrically conductive layer 18 selectively adjusts the first magnetic anisotropy strength of first bimetallic member 4.

Magnetization pinning layer 32 is interposed between second bimetallic member 30 and second electrically conductive layer 20 so that magnetization pinning layer 32 exerts the second strain on second bimetallic member 30, the magnetization pinning layer 32 being anti-ferromagnetic. In this manner, the spin state of second bimetallic member 30 is pinned parallel to the +Z direction by an exchange bias interaction between magnetization pinning layer 32 and second bimetallic member 30 at interface 34.

Power source 24 can be electrically connected to first electrically conductive layer 18 via electrical communication line 26 and to second anisotropy tuning layer 10 via electrical communication line 28. In this manner, power source 24 can provide electrical current through first bimetallic member 4 or can bias second anisotropy tuning layer 10 with the voltage to produce an electric field across first bimetallic member 4 from second anisotropy tuning layer 10 to first anisotropy tuning layer 18.

Further, second power source 90 can be electrically connected to second electrically conductive layer 20 via electrical communication line 94 and to first bimetallic member 4 via electrical communication line 92. In this manner, second power source 90 can bias second anisotropy tuning layer 10 with a fixed potential difference to produce an electric field across second anisotropy tuning layer 10 for developing an electrical current that can be measured by second power source 90. In this manner, an electric current can be measured in response to the fixed potential difference across the second anisotropy tuning layer 10, whose magnitude is related to a spin dependent tunneling between the two ferromagnetic layers (first bimetallic member 4 and second bimetallic member 30) and depends upon the relative alignment angle between spin states of the two bimetallic members 30 and 4. Accordingly, a first magnetic spin state of first bimetallic member 4 is controlled by subjecting, from first power source 24, strain voltage V_strain to piezoelectric layer 2 that produces first strain on first bimetallic member 4. Similarly, a second magnetic spin state of second bimetallic member 30 is controlled by subjecting, from magnetization pinning layer 32, an exchange bias pinning (also referred to as the second strain) to second bimetallic member 30. In this manner, the magnetic spin state of second bimetallic member 30 is permanently fixed and is referred to as a reference layer RL, and first bimetallic member 4 is referred to as a free layer FL. In an embodiment, the second magnetic spin state of reference layer RL (second bimetallic member 30) is selected to be oriented parallel with the positive-Z direction shown in FIG. 13 (also see magnetic switching graph shown in FIG. 20), and the first magnetic spin state of free layer FL (first bimetallic member 4) is selected to have an orientation that is parallel or antiparallel with respect to orientation of the second magnetic spin state of reference layer RL (second bimetallic member 30), based on the first strain from piezoelectric layer 2. As used herein, magnetic spin states are oriented parallel to one another when they point in the same direction in space, e.g., along a +Z- or –Z-direction. As used herein, magnetic spin states are oriented antiparallel to one another when the point in opposite directions (i.e., π radians) in space, e.g., a first magnetic spin state oriented along the +Z-direction, and a second magnetic spin state oriented along the –Z-direction.

Figure 14:
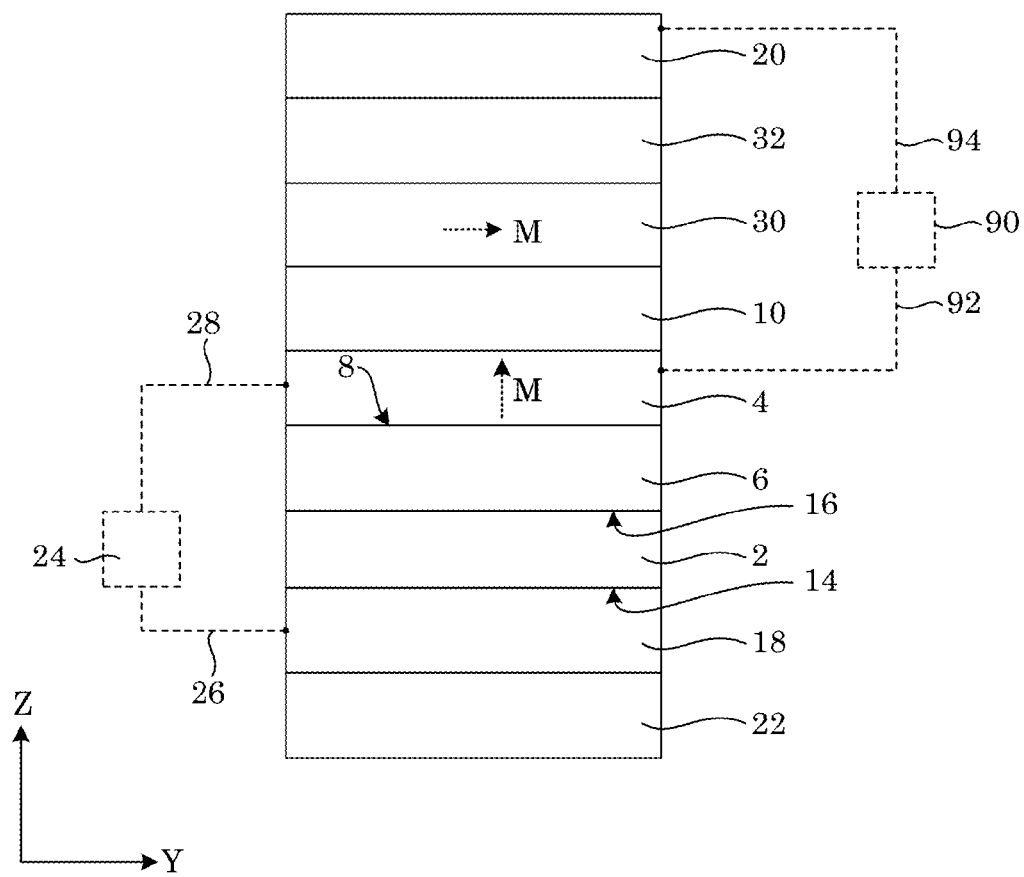
FIG. 14 shows a cross-sectional view of a magnetic piezoelectric memory.

In an embodiment, with reference to FIG. 14, magnetic piezoelectric memory 104 includes second electrically conductive layer 20 disposed on second bimetallic member 30 distal to second anisotropy tuning layer 10 and proximate to second bimetallic member 30, such that second bimetallic member 30 is interposed between second electrically conductive layer 20 and first bimetallic member 4. Second anisotropy tuning layer 10, in combination with magnetization pinning layer 32, selectively adjusts the second magnetic anisotropy strength and spin state direction of second bimetallic member 30. Here, second power source 90 can be electrically connected to first bimetallic member 4 and second electrically conductive layer 20 to provide the potential or electrical current to these layers for the electrical sensing of the spin state direction of first bimetallic member 4 relative to second bimetallic member 30 due to the spin dependent tunneling current in anisotropy tuning layer 10 in response to electric bias from second power source 90 (e.g. measurement of a tunneling magnetoresistance). Additionally, magnetic piezoelectric memory 104 includes first anisotropy tuning layer 6 interposed between piezoelectric layer 2 and first bimetallic member 4. Here, first anisotropy tuning layer 6 provides a spatial preference of magnetization M of bimetallic member 4 in which magnetization M is perpendicular to interface 8 (i.e., along Z axis in FIG. 14) between first anisotropy tuning layer 6 and first bimetallic member 4 in an absence of the first strain from piezoelectric layer 2. Here, second anisotropy tuning layer 10, in combination with first anisotropy tuning layer 6, provides the spatial preference (along direction Z) of magnetization M of first bimetallic member 4 perpendicular to interface 8 between first anisotropy tuning layer 6 and first bimetallic member 4 in the absence of the first strain from piezoelectric layer 2.

Figure 15:
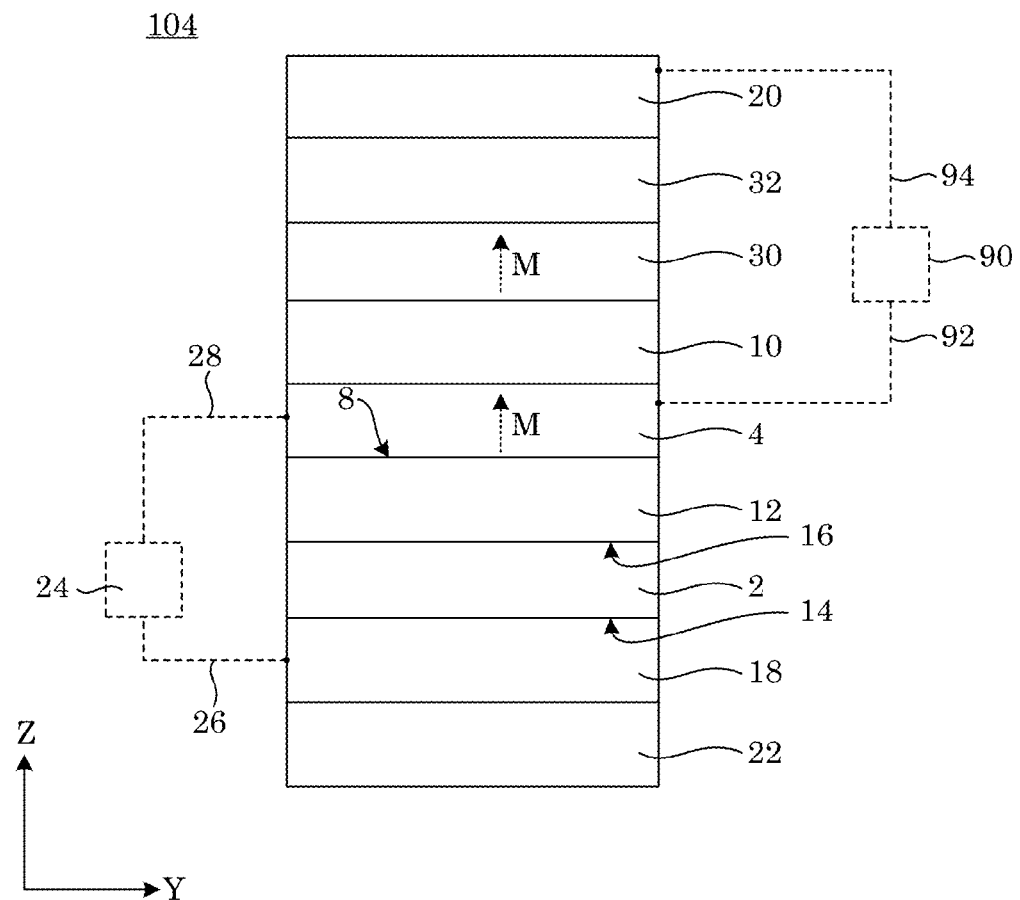
FIG. 15 shows a cross-sectional view of a magnetic piezoelectric memory.

According to an embodiment, with reference to FIG. 15, magnetic piezoelectric memory 104 includes adhesion layer 12 interposed between piezoelectric layer 2 and first bimetallic member 4. In some embodiments, magnetic piezoelectric memory 104 includes a plurality of layers and members as previously described to provide a magnetic memory, wherein second bimetallic member 30 is free layer FL, and first bimetallic member 4 is reference layer RL. Here, power source 24 provides strain voltage V_strain to piezoelectric layer 2, and piezoelectric layer 2 produces the first strain in response to receipt of strain voltage V_strain and subjects first bimetallic member 4 (reference layer RL) to the first strain. Similarly, magnetization pinning layer 32 provides exchange bias to pin the spin state direction of second bimetallic member 30 (reference layer RL) as the second strain. In this manner, the first magnetic spin state of first bimetallic member 4 is controlled by the first strain, and the second magnetic spin state of second bimetallic member 30 is fixed in place by the second strain from magnetization pinning layer 32.

Magnetic piezoelectric composite 100 and articles thereof can include substrate 22. Substrate 22 provides an atomically smooth and flat support to layers (e.g., first anisotropy tuning layer 6 and the like) and members (e.g., bimetallic member 4 and the like) disposed thereon. Substrate 22 can be a thin film, in which the material is amorphous. Exemplary substrates 22 include a dielectric such as silicon dioxide.

In an embodiment, magnetic piezoelectric composite 100 and articles thereof include electrically conductive layer (18 or 20). Electrically conductive layers (18, 20) are selected to provide electrical contact to layers (e.g., first anisotropy tuning layer 6 and the like) and members (e.g., bimetallic member 4 and the like) and independently be a material or stack of materials that have high electrical conductivity and advantageously provide a barrier to oxidation of the layers or members interposed therebetween. Electrically conductive layers (18, 20) independently have a thicknesses (e.g., from 0.3 nanometers (nm) to 50 nm) and independently include a material that forms a compatible interface with the layers (e.g., first anisotropy tuning layer 6 and the like) and members (e.g., bimetallic member 4 and the like) as well as electrical interconnects thereto, e.g., an electrical interconnect that includes Cu, Au, Ru, Ti, Ta, Al, Ag, a combination thereof, or the like.

In an embodiment, electrically conductive layer (18 or 20) independently include a bilayer of Ag (e.g., having a 10 nm thickness) disposed on Ta (e.g., having a 3 nm thickness), wherein the Ta can be proximate to piezoelectric layer 2 while the Ag is distal to piezoelectric layer 2.

In an embodiment, magnetic piezoelectric composite 100 and articles thereof include piezoelectric layer 2. Piezoelectric layer 2 expands along a direction of an electrical potential difference applied thereto. Piezoelectric layer 2 can include a material that expands in response to being subjected to the strain voltage. In an embodiment, piezoelectric layer 2 is a ceramic, e.g., $Pb(Zr_xTi_{1-x})O_3$ (PZT), wherein x is a real number from 0 to 1 such that any stoichiometric ratio of Zr:Ti that provides a room temperature remnant dielectric polarization, an electric coercive field with an electric field strength (e.g., from 0.5 megavolts per meter (MV/m) to 1.5 MV/m), tunability of the first strain along the direction of applied electric field in excess of 0.1%, or the like can be selected. Moreover, piezoelectric layer 2 can have a thickness from 100 nm to 10 millimeters (mm).

In an embodiment, piezoelectric layer 2 has a PZT stoichiometry that is $Pb(Zr_{0.52}Ti_{0.48})O_3$, an electric coercive field of 1.2 MV/m, and thickness of 1 mm.

In an embodiment, magnetic piezoelectric composite 100 and articles thereof include adhesion layer 12 that provides advantageous adhesion or adhesive properties to adhere overlayers thereon when adhesion layer 12 is disposed on piezoelectric layer 2. Adhesion layer 12 also mediates electrical and mechanical coupling to layers disposed when adhesion their 12 is disposed between such layers and piezoelectric layer 2. Adhesion layer 12 can have a thickness from 0.3 nm to 5 nm. Further, adhesion layer 12 can be crystalline, amorphous, or crystallographically isotropic. It is contemplated that adhesion layer 12 can include a material that provides adhesion to piezoelectric layer 2 or electrical connection to piezoelectric layer 2 as well as a compatible interface with the layers disposed on adhesion layer 12. Exemplary materials for adhesion layer 12 include Ti, Ta, Al, and the like. In an embodiment, adhesion layer 12 is amorphous and includes Ta with a thickness of 3 nm.

In an embodiment, magnetic piezoelectric composite 100 and articles thereof include anisotropy tuning layer (6 or 10). Anisotropy tuning letters (6, 10) layers promote a particular crystal structure along the direction collinear with growth of layers on anisotropy tuning layer (6 or 10). Exemplary anisotropy tuning layers (6, 10) independently include materials that can induce a face-centered-cubic (111)-orientation (e.g., materials such as Cu, $Al_2O_3$, Pt, Au, Pd, Ag, and the like), body-centered cubic (001)-orientation (e.g., material such as MgO, $HfO_2$, $TiO_2$, V, Cr, Mo, W, Ta, and the like), and the like with a thickness from 1 nm to 10 nm.

In an embodiment, anisotropy tuning letters (6, 10) are 2-nm-thick Pt layers that exhibit an fcc (111) crystallographic orientation along the growth direction of the layers grown thereon.

In an embodiment, magnetic piezoelectric composite 100 and articles thereof include magnetization pinning layer 32. Magnetization pinning layer provides an interfacial exchange bias interaction to pin the spin state direction of proximate second bimetallic member 30 (reference layer RL) as the second strain. Exemplary magnetization pinning layers include anti-ferromagnetic metal alloys (PtMn, IrMn, and the like) and dielectric oxides ($Cr_2O_3$, NiO, CoO, $Fe_3O_4$) with a thickness from 1 nm to 20 nm.

Figure 16:
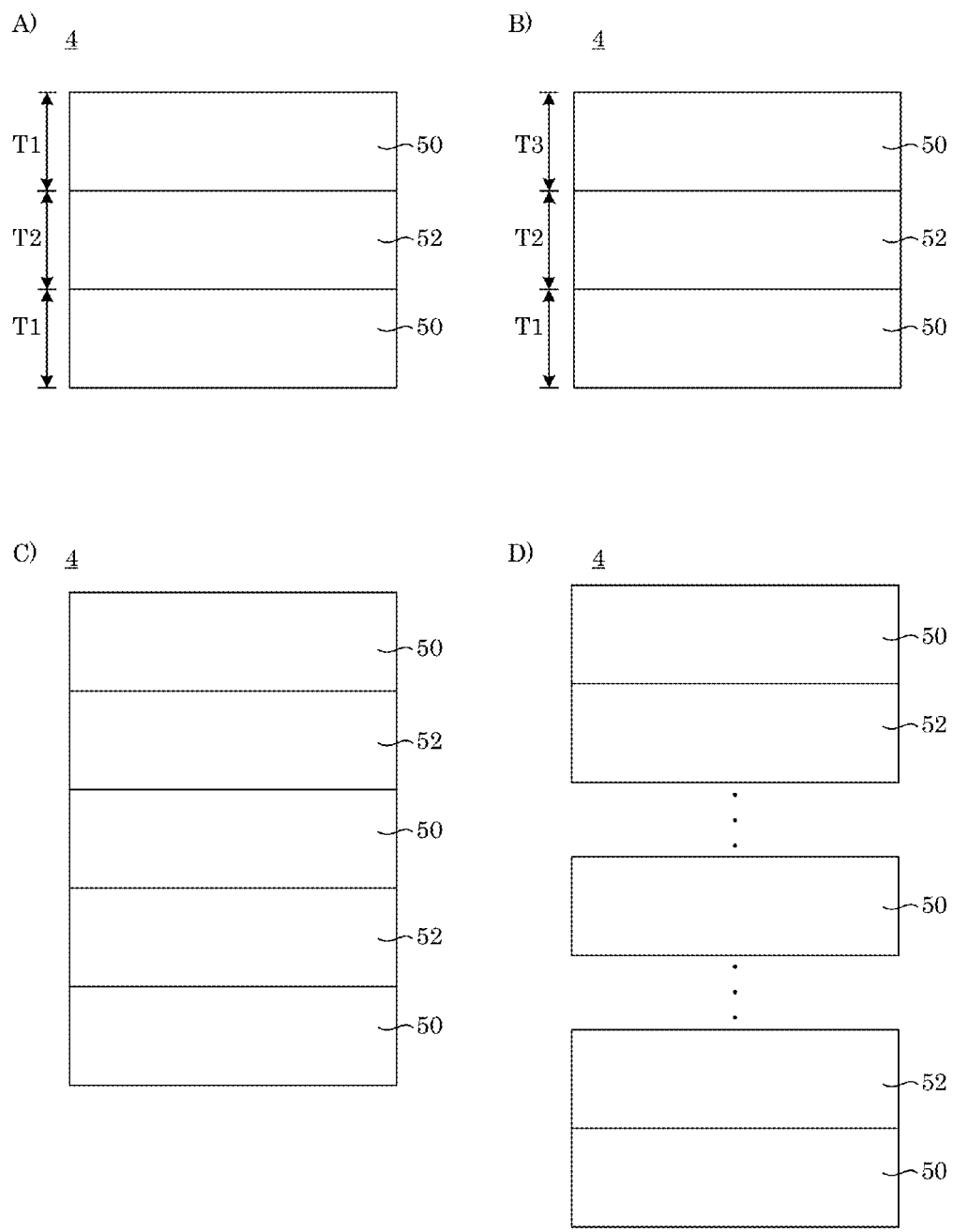
FIG. 16 shows cross-sectional views of a plurality of bimetallic members.

In an embodiment, magnetic piezoelectric composite 100 and articles thereof include bimetallic member (e.g., 4, 30). Bimetallic members (4, 30) independently include a plurality of metal layers that are stackably disposed and that promote out-of-plane alignment of magnetization M within each bimetallic member (4, 30). In an embodiment, bimetallic members (4, 30) independently include a binary magnetic film heterostructure, e.g., grown or disposed on anisotropy tuning layer 6. Bimetallic members (4, 30) independently can include a ferromagnetic layer (e.g. Fe, Co, Ni, and the like) that can be alloyed (e.g., with a non-magnet (e.g. Pd, Pt, and the like) or another magnet (e.g., to form an alloy such as FeCo, NiFe, CoNi, and the like)) or stacked alternatingly (e.g., with a nonmagnet (e.g., Pd, Pt, and the like) or another magnet (e.g., to form stacked Co/Ni). In an embodiment, bimetallic member (4 or 30) is an alternatingly stacked binary heterostructure as shown in FIG. 16. With reference to FIG. 16, bimetallic structure (4 or 30) can include a plurality of metal layers (50, 52), wherein second metal layer 52 is interposed between a pair of first metal layers 50. A total number of layers can be selected to provide a selected magnetic anisotropy strength and can be, e.g., 3 (panel A of FIG. 16), 5 (panel C of FIG. 16), . . . , 2n+1 (panel D of FIG. 16), wherein n is an integer. A thickness of first metal layers can be the same (e.g., first thickness T1) or different (e.g., first thickness T1 and third thickness T3). A thickness of second metal layer 52 can be second thickness T2, wherein second thickness T2 can be the same or different from first thickness Ti or third thickness T3.

According to an embodiment, bimetallic member 4 includes first metal layer 50 that includes cobalt and second metal are 52 that includes nickel interposed between a pair of first metal layers 50. In an embodiment, bimetallic member 4 is grown on anisotropy tuning layer 6, wherein anisotropy tuning layer 6 includes Pt(111).

A thickness of first metal layer 50 and second metal layer 52 independently can be from 0.1 nm to 2 nm, specifically from 0.15 nm to 0.8 nm, more specifically the thickness of first metal layer 50 (e.g., Co) is center than a thickness of second metal are 52 (e.g., Ni). The number of binary repeats of first metal layer 50 and second metal are 52 in bimetallic member 4 can be one repeat to less than or equal to twenty repeats. In an embodiment, the number of repeats is from 4 to 8 repeats. It is contemplated that, after a desired quantity of bilayer repeats have been deposited, first metal layer 50 of bimetallic member 4 is disposed on top of the other layers (50 and 52) of the bilayer repeats to form bimetallic member 4.

In an embodiment, bimetallic member (4, 30) include a 0.15 nm Co and 0.6 nm Ni bilayer arranged respectively as first metal layer 50 and second metal layer 52, repeated four times to provide the ordering: Co/Ni/Co/ . . . /Ni/Co).

Figure 17:
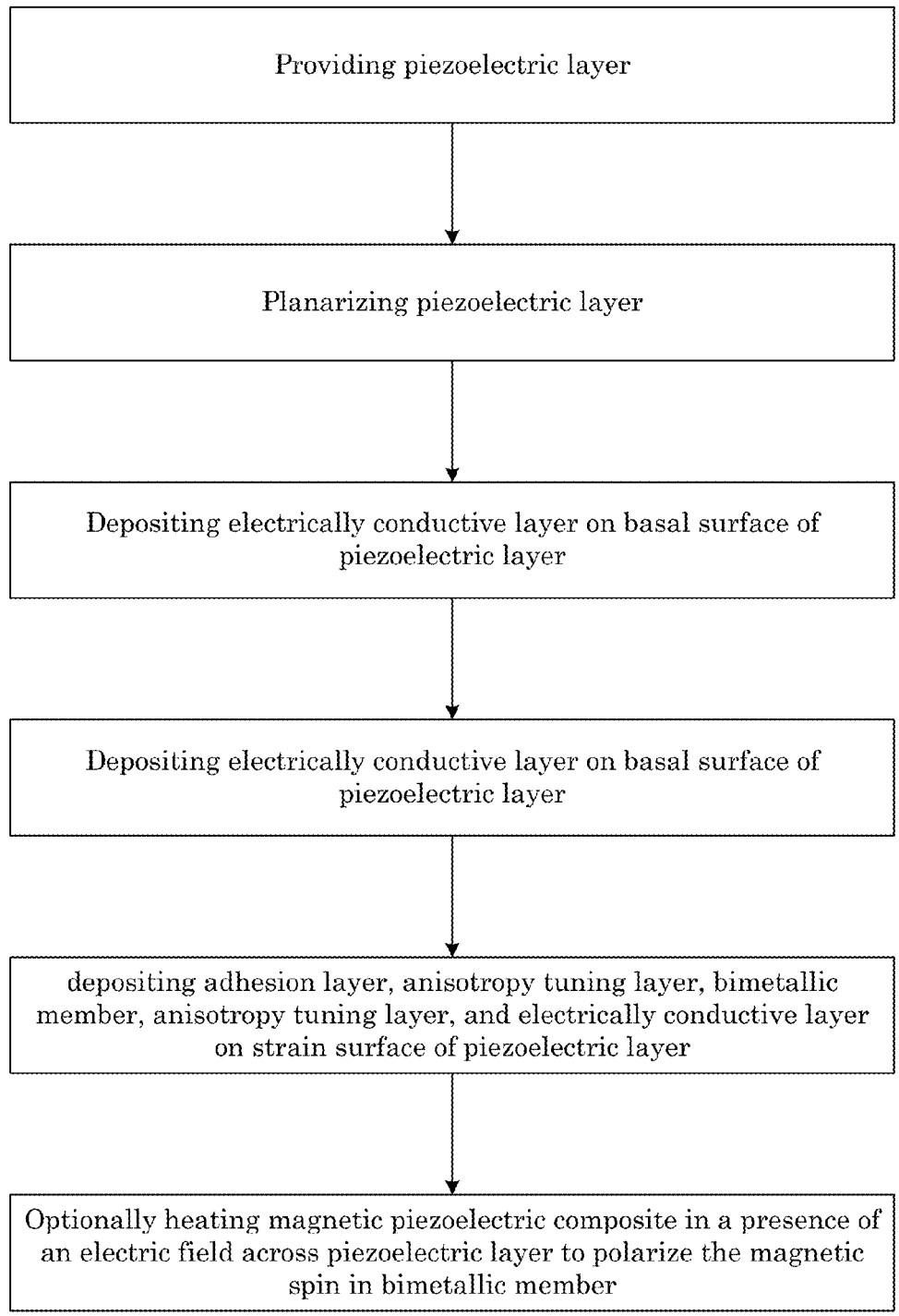
FIG. 17 shows a flow chart for a process for making a magnetic piezoelectric composite.

In an embodiment, with reference to FIG. 17, a process for making magnetic piezoelectric composite 100 and articles thereof include providing piezoelectric layer 2 (step 202); planarizing basal surface 14 and screen surface 16 of piezoelectric layer 2 (step 204); depositing electrically conductive layer 18 on basal surface 14 of piezoelectric layer 2 (step 206); and depositing adhesion layer 12, anisotropy tuning layer 6, bimetallic member 4, anisotropy tuning layer 10, and electrically conductive layer 20 on strain surface 16 of piezoelectric layer 2 (step 208) to form magnetic piezoelectric composite 100. The process further can include optionally heating magnetic piezoelectric composite 100 in a presence of an electric field across piezoelectric layer 2 (i.e., along this Z-direction shown in FIG. 1) to polarize the magnetic spin in bimetallic member 4.

Figure 18:
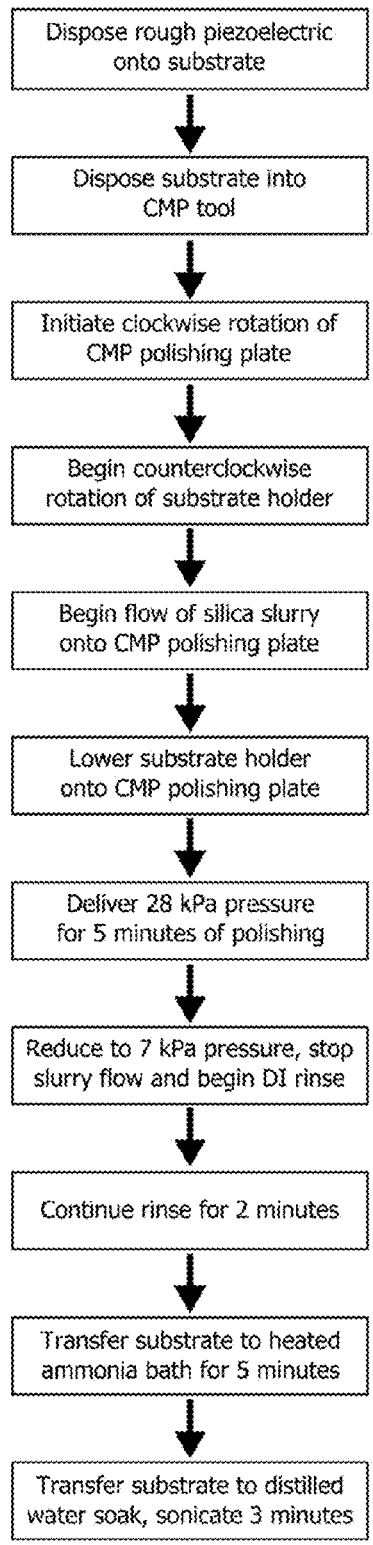
FIG. 18 shows a flow chart for a process for chemical-mechanical planarization of surfaces of a piezoelectric layer.
Figure 19:
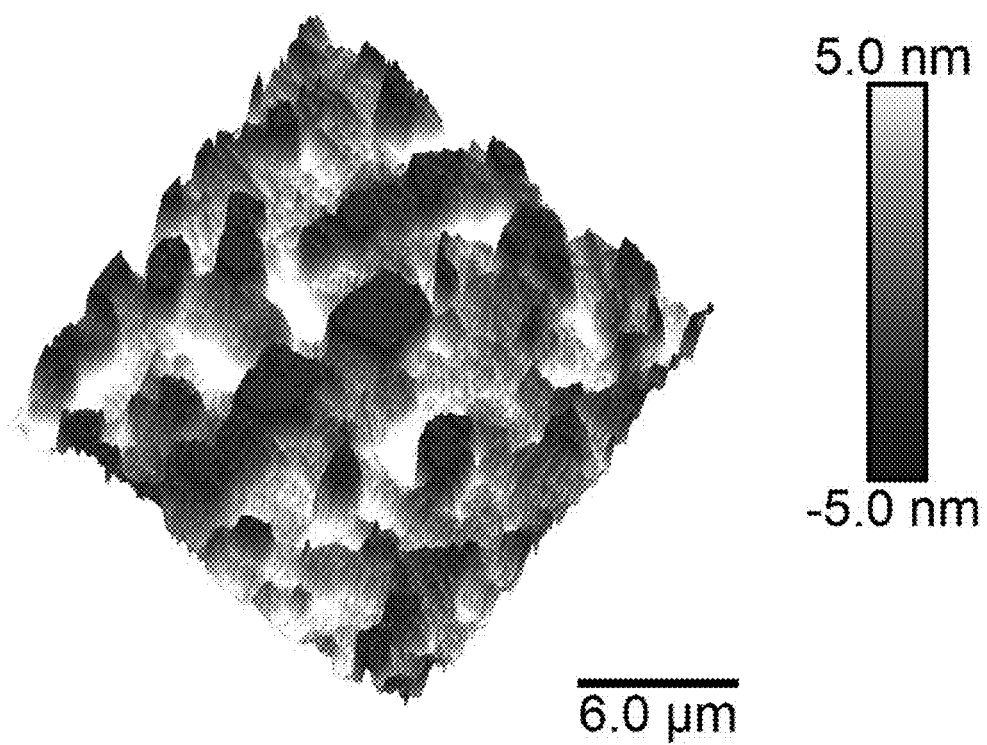
FIG. 19 shows an atomic force micrograph of a 30 micrometer (μm) by 30 μm area of a surface of a piezoelectric layer after chemical-mechanical planarization according to the process shown in FIG. 18.

In the process for making magnetic piezoelectric composite 100 and articles thereof, planarizing piezoelectric layer 2 includes chemically- and mechanically planarizing (CMP) basal surface 14 and strain surface 16 of piezoelectric layer 2 to provide low roughness on which to perform vapor deposition of overlaid thin films (e.g., anisotropy tuning layer 6). Prior to this planarization, piezoelectric layer 2 can have a surface roughness from 100 nm root-mean-squared (rms) to 1000 nm rms. A commercially available CMP tool (e.g., Bruker Model CP-4) is used to reduce the surface roughness of piezoelectric layer 2 to a surface roughness from 0.3 nm rms to 10 nm rms, as evaluated from performing atomic force microscopy on a 30 micrometer (μm) by 30 μm surface area of piezoelectric layer 2 after processing. Such a micrograph is shown in FIG. 19 in which CMP reduced surface roughness of piezoelectric layer 2. With reference to FIG. 18, a CMP process used included subjecting piezoelectric layer 2 for 5 minutes under 28 kilopascals (kPa) downward pressure with a 60 milliliter per minute (mL/minute) flow rate of a 1:5 silica slurry (commercially available as Ultra-Sol 556 Colloidal Silica from Eminess USA) to a distilled water dilution followed by a 2 minute rinse under 7 kPa downward pressure with a 90 mL/minute flow of distilled water. This cycle could be repeated from 2 to 20 times. The cycle was repeated between 6 and 8 times after which piezoelectric layer 2 was transferred from the CMP tool to a slurry-removing module. The slurry-removing module included a warm bath in a dilute ammonia solution heated to 80° C. for five minutes, followed by a distilled water soak with ultrasonic agitation for three minutes. As a result, piezoelectric layer 2 had an rms surface roughness less than 3 nm, as shown in FIG. 19.

In the process for making magnetic piezoelectric composite 100 and articles thereof, depositing electrically conductive layers (18, 20) includes vapor deposition or deposition by painting a conducting epoxy, e.g., basal surface 14 of piezoelectric layer 2. In an embodiment, a conducting Ag epoxy is painted onto basal surface 14 of piezoelectric layer 2.

In the process for making magnetic piezoelectric composite 100 and articles thereof, depositing layers (12, 6, 4, 10, 20, 30, and the like) on strain surface 16 of piezoelectric layer 2 includes sequential vapor deposition of respective layers, e.g., in an order shown in FIG. 1 to FIG. 16. In an embodiment, the layers or vapor deposited in a vacuum chamber with a base pressure, e.g., less than or equal to $6.6 \times 10^{-6}$ Pa ($5 \times 10^{-8}$ Torr) in a presence of a noble gas (e.g., Argon) ion pressure of $5.3 \times 10^{-1}$ Pa ($4 \times 10^{-3}$ Torr) to enable dc magnetron sputtering of raw materials for forming the layers (e.g., 12, 6, 4, 10, 20, 30, and the like).

In the process for making magnetic piezoelectric composite 100 and articles thereof, poling piezoelectric layer 2 includes disposing magnetic piezoelectric composite 100 or article thereof in a heated dielectric fluid bath in a presence of an electric field across the thickness of piezoelectric layer 2. A magnitude of the poling electric field can exceed the electric coercive field of piezoelectric layer 2 to set its polarization direction. The polarization direction establishes the sign of electric fields that will generate tensile strains collinear to the poling axis. For linear, deterministic operation, the polarization direction of piezoelectric layer 2 is not reversed such that electric fields applied in the direction opposite to the poling direction are less than the electric coercive field. An electric field is generated by applying a voltage difference between the electrically conductive layers 18 and 20 to polarize magnetic piezoelectric composite 100 or article thereof. A dielectric fluid in the bath can include an oil such as a mineral oil, a silicon-based oil, and the like such as a fluorinated oil (e.g., trademarked as FLUORINERT fluid, which is commercially available from Sigma-Aldrich Co.). In an embodiment, the poling bath is maintained at a fixed temperature from 60° C. to 100° C. during poling from 30 minutes to 90 minutes, and specifically from 70° C. to 85° C. for poling from 45 minutes to 50 minutes.

Magnetic piezoelectric composite 100 and articles thereof have numerous beneficial uses, including control of magnetic memory and sensing magnetic fields respectively with magnetic piezoelectric memory 104 and magnetic piezoelectric sensor 102. Control occurs via application of a strain to the first bimetallic member (e.g., 4). In an embodiment, a process for controlling a memory state of magnetic piezoelectric memory 104 includes: providing magnetic piezoelectric composite 100, wherein first bimetallic member 4 is a free layer FL; disposing second bimetallic member 30 on magnetic piezoelectric composite 100 interposedly between second anisotropy tuning layer 10 and second electrically conductive layer 20, wherein second anisotropy tuning layer 10 is electrically nonconductive; fixing the magnetization direction of second bimetallic member 30 such that second bimetallic member 30 is a reference layer RL; applying a transient voltage across the thickness of piezoelectric layer 2 to generate the first strain from piezoelectric layer 2; subjecting first bimetallic member 4 to the first strain from piezoelectric layer 2; producing a strain-induced torque on the magnetization that tends to rotate the magnetization axis of first bimetallic member 4 away from the perpendicular-to-the-plane direction in response to receipt to the first strain from piezoelectric layer 2, such that a magnetization direction of first bimetallic member 4 is rendered susceptible to re-orientation relative to the magnetization direction the first bimetallic member 4 in an absence of the strain-induced torque on the perpendicular-to-the-plane magnetization orientation of first bimetallic member 4; subjecting first bimetallic member 4 to a transient, external stimulus (e.g., a thermal agitation, applied external magnetic field, a spin-polarized electric current communicated through magnetic piezoelectric memory 104) in combination with the transient voltage to achieve a reorientation of the magnetization of first bimetallic member 4; determining a difference between an initial magnetization direction and a subsequent magnetization direction of first bimetallic member 4, wherein the determination is made based on a magnetoresistance of magnetic piezoelectric memory 104 as measured by second power supply 90; and removing the transient, external stimulus when first bimetallic member 4 is provided with a selected final magnetization direction to control the memory state of magnetic piezoelectric memory 104. As used herein, "memory state" refers to the direction of the magnetization of second bimetallic member 30 relative to the direction of the magnetization of first bimetallic member 4.

In the process for controlling the memory state of magnetic piezoelectric memory 104, providing magnetic piezoelectric composite 100 includes magnetic piezoelectric composite 100 that has a ferromagnetic layer (e.g. Fe, Co or Ni) that can be alloyed with non-magnetic materials (e.g. B, V, Pd or Pt) or another magnet (e.g. FeCo or FeCoB or FeCoV or NiFe or CoNi) or that can be stacked alternatingly with a nonmagnet (e.g. Pd or Pt) or another magnet (e.g. Co/Ni).

In the process for controlling the memory state of magnetic piezoelectric memory 104, using a thin (e.g. between 0.5 nanometers and 3 nanometers), non-conducting tunneling barrier as anisotropy tuning layer 10 includes disposing a non-conducting oxide layer (e.g., MgO, $TiO_2$, $Al_2O_3$, $HfO_2$, and the like) between first bimetallic member 4 and second bimetallic member 30 such that communication of electrical current between first bimetallic member 4 and second bimetallic member 30 is accomplished by tunneling across non-conducting tunneling barrier anisotropy tuning layer 10.

In the process for controlling the memory state of magnetic piezoelectric memory 104, fixing the magnetization direction of second bimetallic member 30 includes setting a preferred magnetization orientation of second bimetallic member 30 that remains fixed (i.e. does not change) under a tolerated external system perturbation. As used herein, "tolerated" refers to a magnitude and duration of an external physical stressor that when exceeded could change the operational behavior of an article under stress. In the context of fixing the magnetization direction of second bimetallic member 30, a tolerated stressor would not exceed a critical magnitude or duration that would otherwise compromise the fixing of the magnetization direction of said layer. As used herein, "external system perturbation" refers to an external temperature, external magnetic field, and the like.

In the process for controlling the memory state of magnetic piezoelectric memory 104, using first bimetallic member 4 as free layer FL includes varying the magnetization direction of first bimetallic member 4 during operation.

In the process for controlling the memory state of magnetic piezoelectric memory 104, applying a transient voltage across the thickness of piezoelectric layer 2 includes attaching power source 24 to basal surface 14 and strain surface 16 of piezoelectric layer 2 to apply a non-zero electrical potential difference across piezoelectric layer 2.

In the process for controlling the memory state of magnetic piezoelectric memory 104, the non-zero electrical potential difference across piezoelectric layer 2 between basil surface 14 and strain surface 16 controls the electric field magnitude and sign of the electric field such that the electric field strength remains within a selected operating region for a linear operation of magnetic piezoelectric memory 104 with respect to a poling direction and the electric coercive field such that electric field is less than or equal to the electric coercive field opposite to the poling direction or can be greater than or equal to the electric coercive field in the direction of the poling direction.

Figure 20:
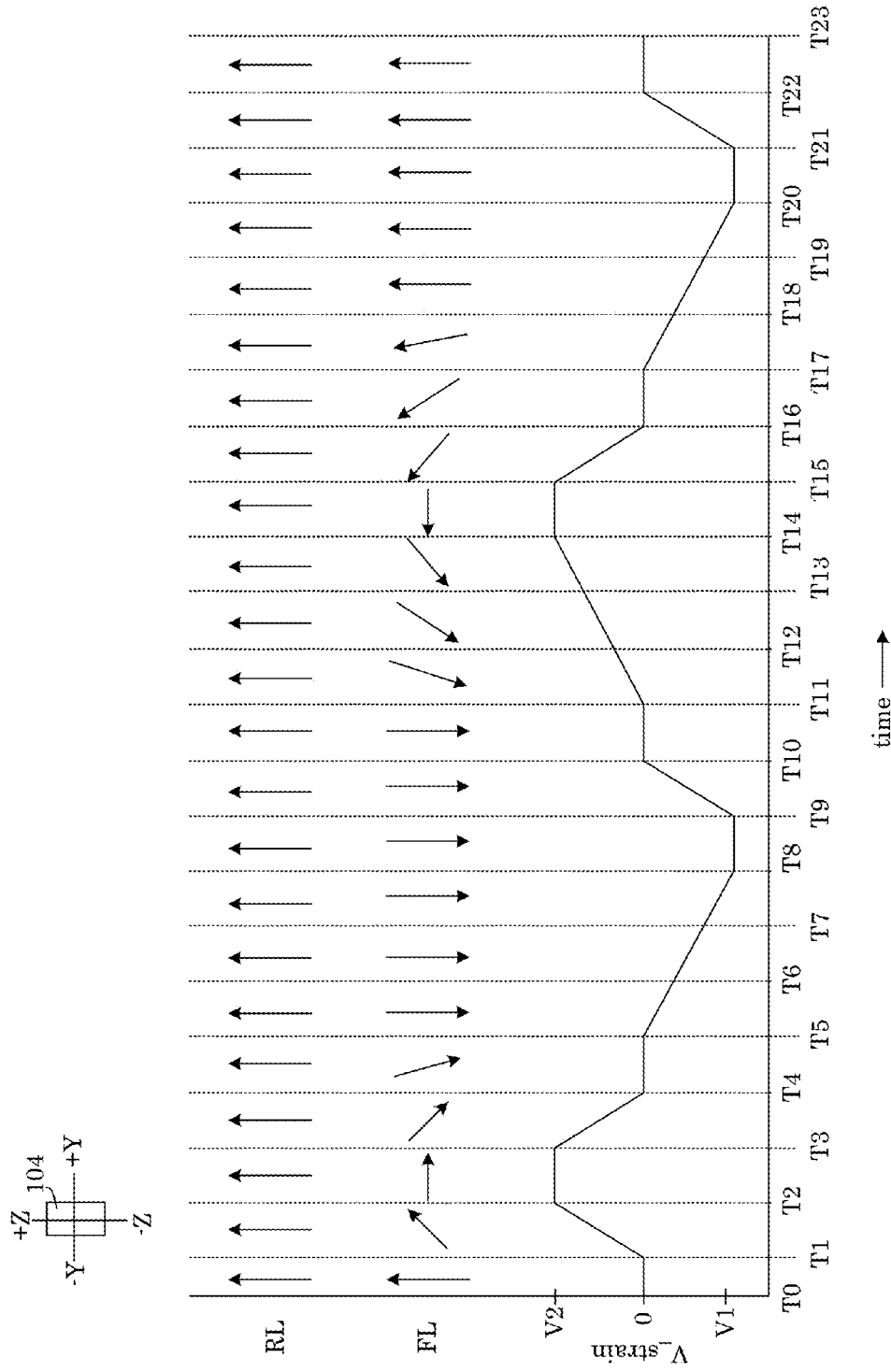
FIG. 20 shows a graph of strain voltage versus time and corresponding spin states for a second bimetallic member (reference layer (RL) and first bimetallic member (free layer (FL)) in a magnetic piezoelectric memory.
Figure 21:
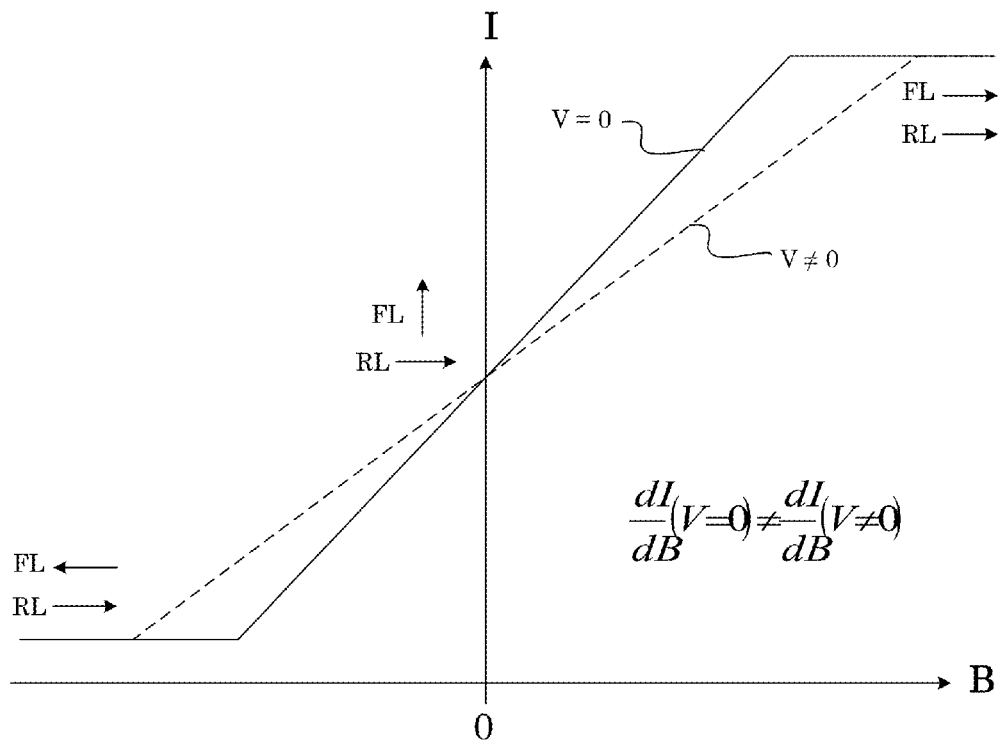
FIG. 21 shows a graph of magnetoresistance (MR) current (I) versus magnetic field strength (B) and corresponding spin states of a second bimetallic member (reference layer (RL) and first bimetallic member (free layer (FL)) in a magnetic piezoelectric sensor.
Figure 21:
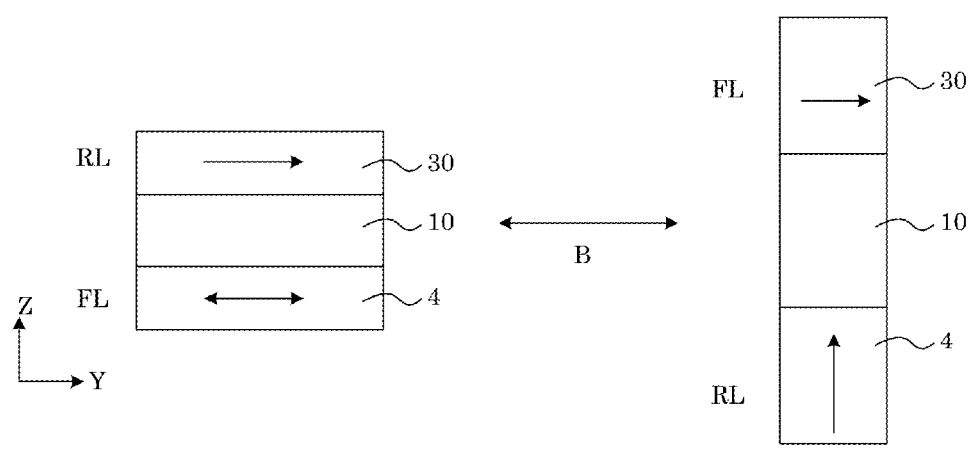
Figure 22:
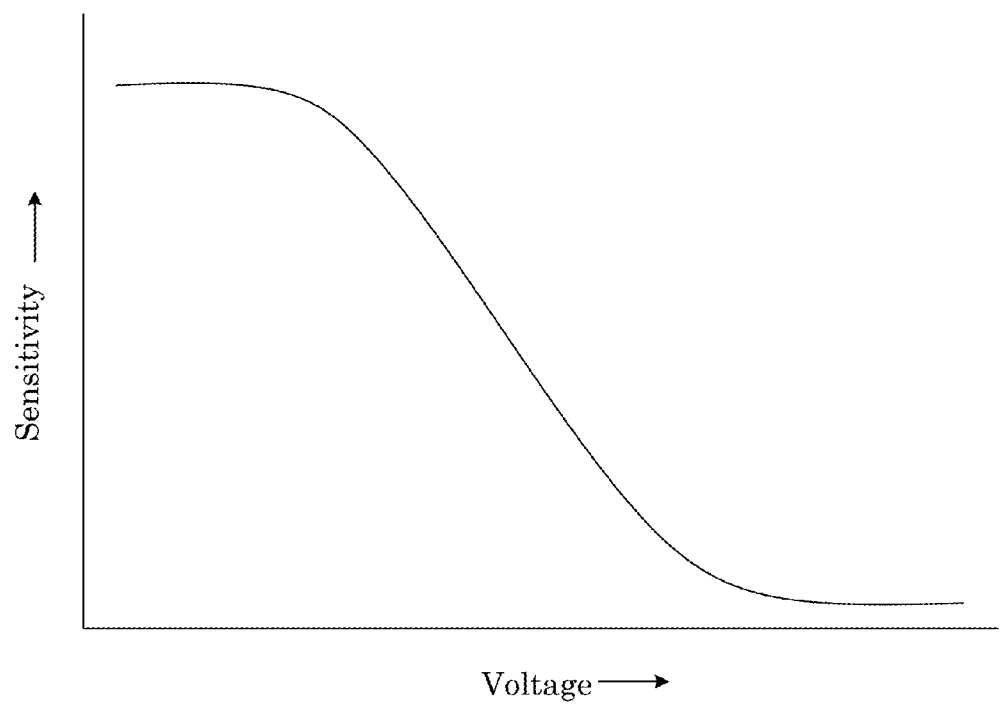
FIG. 22 shows a graph of sensitivity versus voltage for a magnetic piezoelectric sensor.
Figure 23:
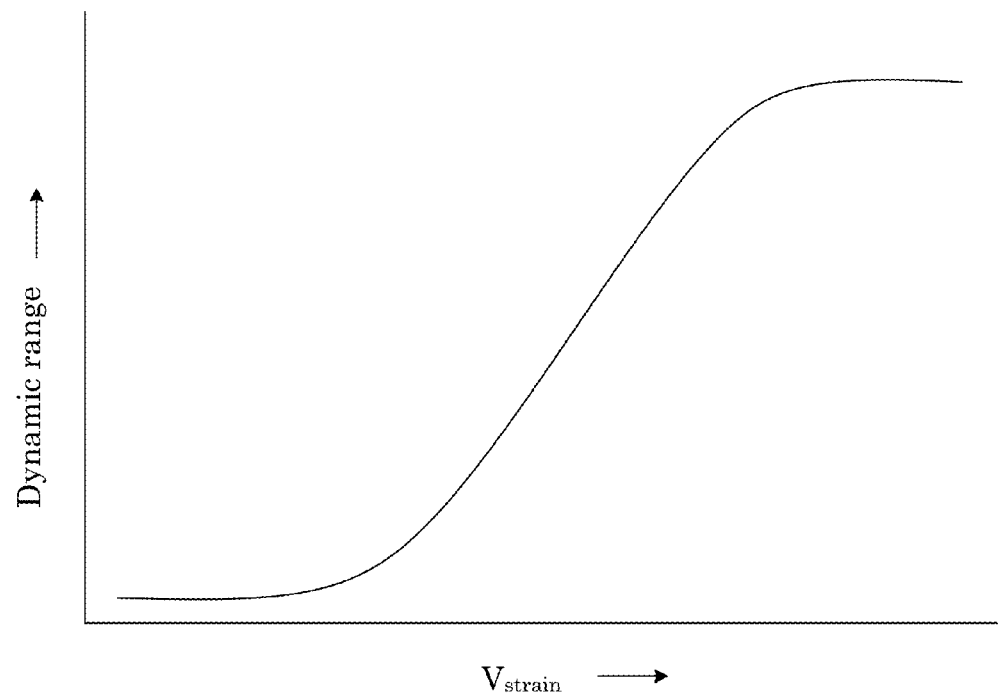
FIG. 23 shows a graph of dynamic range versus voltage for a magnetic piezoelectric sensor.

In an embodiment, with reference to FIG. 20, a relative orientation of the directions of magnetizations of first bimetallic member 4 and second magnetic member 30 in terms of the first magnetic spin state of first bimetallic number 4 (free layer FL) and the second magnetic spin state of second bimetallic member 30 (reference layer RL) is controlled in magnetic piezoelectric memory 104. Here, at time T0, strain voltage V_strain of 0 Volts is applied to piezoelectric layer 2 that subjects first bimetallic member 4 with the first strain having a zeroth magnitude, wherein the second magnetic spin state of reference layer RL is spin up (i.e., oriented in +Z-direction), and the first magnetic spin state of free layer FL is spin up. From time T1 to time T2, strain voltage V_strain is increased to second voltage V2, wherein the second magnetic spin state of reference layer RL is spin up (i.e., oriented in +Z-direction), and the first magnetic spin state of free layer FL is spin up. From time T2 to time T3, strain voltage V_strain is maintained at second voltage V2, wherein the second magnetic spin state of reference layer RL is spin up (i.e., oriented in +Z-direction), and the first magnetic spin state of free layer FL rotates onto the horizontal (+Y direction) and oriented perpendicular to the second spin state. From time T3 to time T4, strain voltage V_strain is decreased from second voltage V2 to zero voltage, wherein the second magnetic spin state of reference layer RL is spin up, and the first magnetic spin state of free layer FL rotates out of the plane toward spin down and antiparallel to the reference layer. From time T4 to time T5, strain voltage V_strain is maintained at zero voltage, wherein the second magnetic spin state of reference layer RL is spin up, and the first magnetic spin state of free layer FL remains spin down and antiparallel to the reference layer. From time T5 to time T8, strain voltage V_strain is decreased from zero voltage to first voltage V1, wherein the second magnetic spin state of reference layer RL is spin up, and the first magnetic spin state of free layer FL stays fixed as spin down and anti-parallel to the reference layer during time T8 to time T11. From time T11 to time T14, strain voltage V_strain is increased, wherein the first magnetic spin state of the free layer FL rotates onto the horizontal (-Y direction) from spin down at time T14 to be perpendicular to the second spin state during time T14 to time T16. Subsequently, as strain voltage V_strain is reduced back to zero, the second magnetic spin state of free layer FL is changed from spin horizontal to spin up and parallel to the second spin state during T18 to T23. It will be appreciated that FIG. 20 shows two cycles of changing the direction of the magnetization of the magnetic spin state of first bimetallic member 4 relative to second bimetallic member 30, and it is contemplated that the direction the magnetization can be changed as many times as desired while magnetic piezoelectric memory 104 is intact. In this manner, a memory state of magnetic piezoelectric memory 104 can be written or read based on the relative directions of the first and the second spin state, wherein parallel oriented first magnetic spin state and second magnetic spin state can indicate a bit value of zero, and anti-parallel oriented first manic spin state and second magnetic spin state can indicate a bit value of one. Accordingly, magnetic piezoelectric memory 104 provides binary encoded magnetic memory.

In an embodiment, magnetic piezoelectric sensor 102 provides a response to a strength of a magnetic field subjected thereto from a source external to magnetic piezoelectric sensor 102. Here, under a sufficiently large external magnetic sensing field along the −Y direction, the first magnetic spin state of bimetallic member 4 is spin-down (i.e., oriented in −Y-direction) and anti-parallel to the second magnetic spin state of bimetallic member 30 is up (i.e., oriented in +Y-direction). Similarly, under a sufficiently large external magnetic sensing field along the +Y direction, the first magnetic spin state of bimetallic member 4 is spin-up (i.e., oriented in +Y-direction) and parallel to the second magnetic spin state of bimetallic member 30 is up (i.e., oriented in +Y-direction). On the other hand, as the magnitude of the external sensing field along the Y axis is reduced below the field that saturates the first magnetic spin state of bimetallic member 4 either up- or down, the magnetic spin state of bimetallic member 4 is rotated onto the vertical (Z axis) in linear proportion to the external sensing field and at zero external sensing field the first magnetic spin state of bimetallic member 4 can become entirely aligned onto the vertical (Z axis). The magnitude of the aforementioned linear proportionality represents the magnetic field sensitivity of such a magnetic piezoelectric sensor 102. Additionally, the magnitude of the external sensing field along the Y axis that saturates the first magnetic spin state of bimetallic member 4 is a limiting factor on the operating dynamic range of such a magnetic piezoelectric sensor 102. However, if a strain voltage V is increased from zero voltage to first voltage V, the saturating magnetic sensing field and the magnetic field sensitivity of the first bimetallic member 4 are increased and decreased, respectively. Upon reducing the strain voltage from first voltage V back to zero voltage, the magnitudes of the saturating magnetic sensing field and the magnetic field sensitivity of the first bimetallic member 4 are restored back to their respective pre-strain-voltage values. In this manner, a magnetic field sensing configuration of magnetic piezoelectric sensor 102 can be changed with application of a bias voltage to piezoelectric layer 2. Accordingly, magnetic piezoelectric sensor 102 provides reconfigurable magnetic field sensing with voltage-reconfigurable sensitivity and dynamic range.

Figure 24:
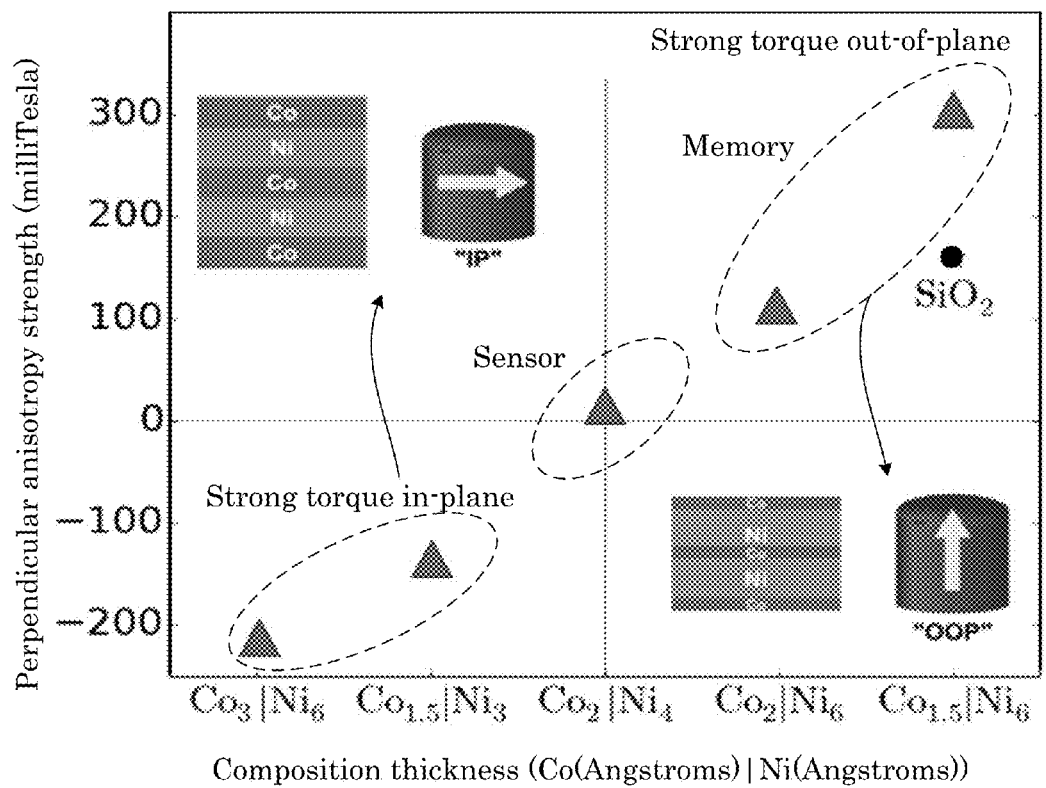
FIG. 24 shows a graph of perpendicular magnetic anisotropy strength versus composition of a bimetallic layer (e.g., cobalt-nickel thickness in Angstroms)
Figure 25:
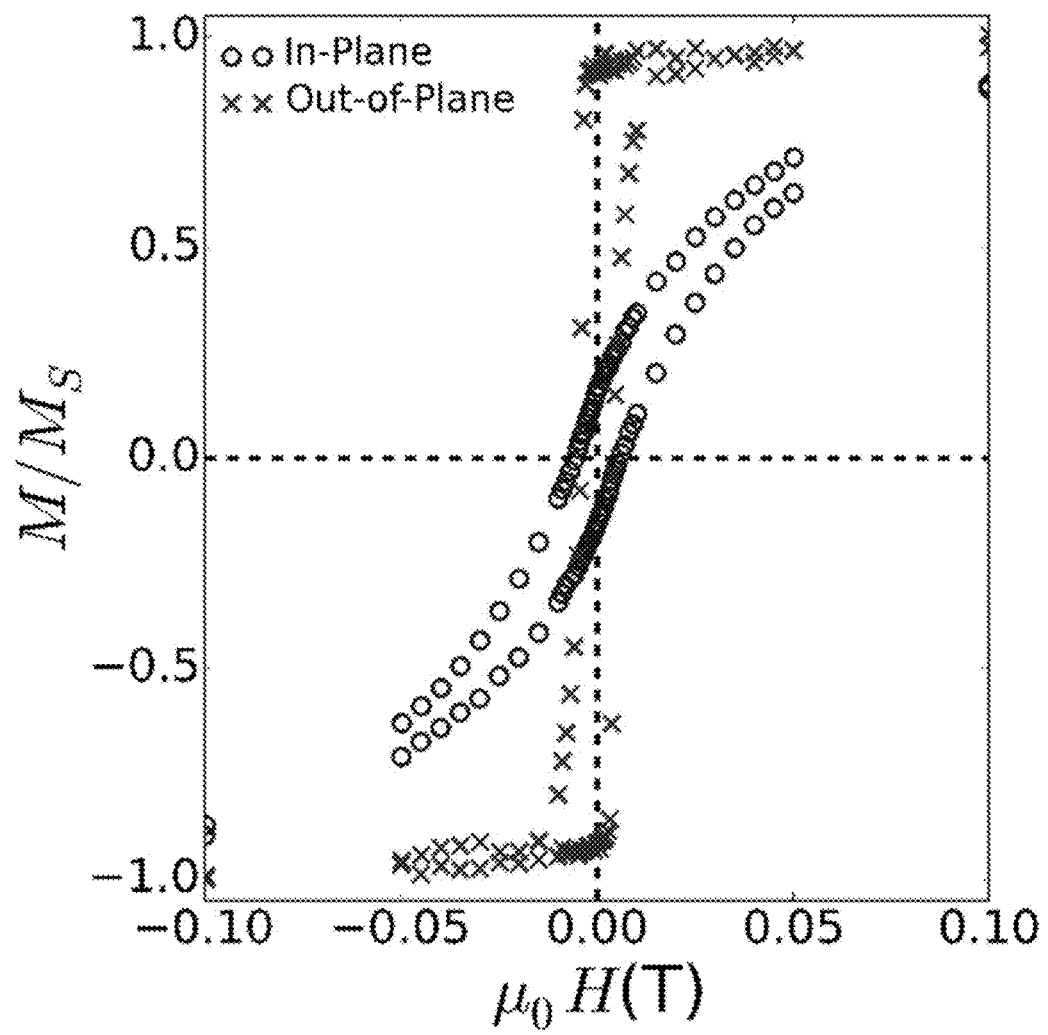
FIG. 25 shows a graph of magnetization strength (normalized to saturation magnetization strength) versus magnetic field strength for a magnetic piezoelectric memory.

Magnetic piezoelectric composite 100, magnetic piezoelectric memory 104, and magnetic piezoelectric sensor 102 (collectively referred to hereinafter as the article) have numerous advantageous and beneficial properties, including enhanced perpendicular magnetic anisotropy and voltage-modulated magnetic anisotropy. In enhanced perpendicular magnetic anisotropy, magnetic piezoelectric composite 100 and articles thereof has a stronger perpendicular magnetic anisotropy (more than 50% larger) compared with a device that has a bimetallic member in an absence of piezoelectric layer 2, as shown in FIG. 24. As shown in FIG. 25, remagnetization of the article under a perpendicular-to-the-plane applied magnetic field occurs at a significantly lower magnetic field strength than remagnetization of the article under a planar applied magnetic field. Moreover, when the article is remagnetized perpendicular-to-the-plane, it retains over 90 percent of its magnetization in the direction of the field after the magnetic field is reduced to zero, which contrasts significantly with the nearly 75 percent decrease in planar magnetization after planar remagnetization. These properties are an indication of the perpendicular anisotropy field strength of the article.

Surprisingly, modest electric fields produced in piezoelectric layer 2 can modify the perpendicular magnetic anisotropy field of the article by tens of milliTesla (mT), enabling voltage control of perpendicular magnetic anisotropy.

The article has a perpendicular anisotropy field that can be from −0.25 Tesla (T) to 0.45 T, specifically from 0.05 T to 0.35 T, and more specifically from 0.15 T to 0.31 T. Thinner cobalt layers in bimetallic member (4 or 30) provide higher perpendicular anisotropy field strength than thicker layers. Moreover, a higher density of interfaces (e.g. more bilayer repeats per unit thickness) provide a greater perpendicular anisotropy field strength than having a fewer number of metal layers in bimetallic member (4, 30).

Figure 26:
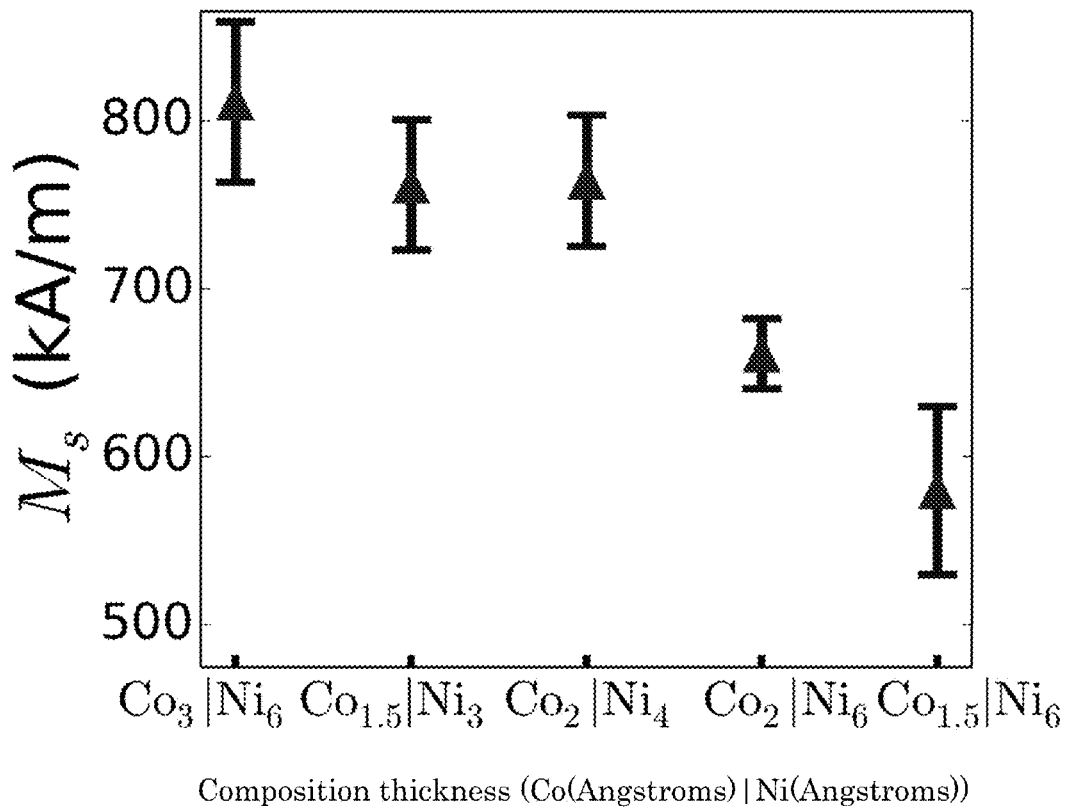
FIG. 26 shows a graph of saturation magnetization strength versus composition of a bimetallic layer (e.g., cobalt-nickel thickness in Angstroms)

As shown in FIG. 26, saturation magnetization density of the article can be from 490 kiloamps per meter (kA/m) to 1400 kA/m, specifically from 600 kA/m to 1000 kA/m, and more specifically from 650 kA/m to 950 kA/m. A greater amount of cobalt in bimetallic member (4 or 30) provides a greater saturation magnetization, and a lower amount of cobalt provides a lower saturation magnetization.

An electrically-induced anisotropy field change of the article can be as large as 0.1 T, specifically as large as 0.05 T, and more specifically as large as 0.03 T. As used here, "electrically-induced" refers to generating an electric field of 2 megavolts per meter (MV/m) within piezoelectric layer 2.

Figure 27:
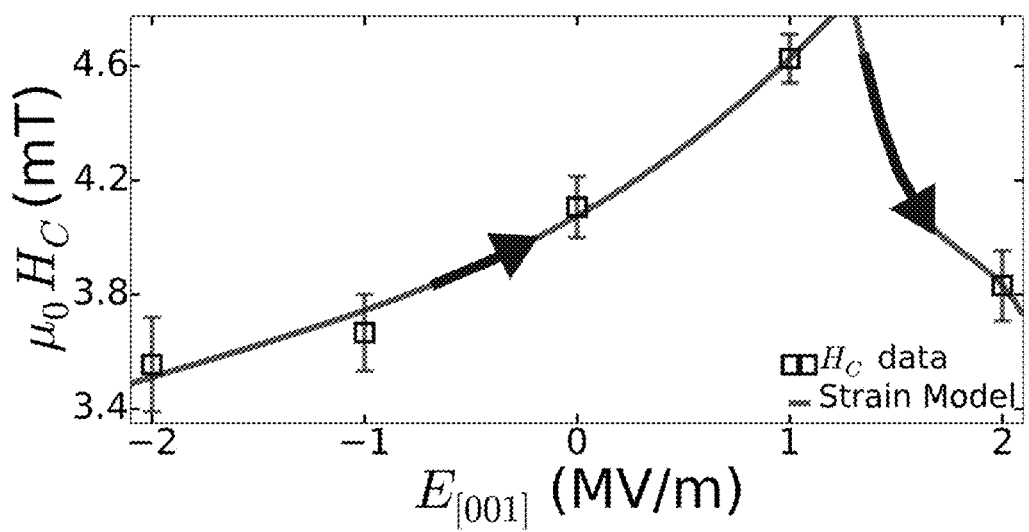
FIG. 27 shows a graph of magnetic coercive field versus electric field strength for a magnetic piezoelectric composite.

As shown in FIG. 27, an electrically-induced coercive field change of the article can be from 0.003 T to 0.005 T. Surprisingly, the electrically-induced coercive field change of the article can modify the magnetic reversal field of 0.004 T by over 30%, a relatively high magnetoelectric efficiency, through reduction of the perpendicular magnetic anisotropy.

The articles and processes herein are illustrated further by the following Example, which is non-limiting.

EXAMPLE

Electric-field assisted magnetization switching of a PZT/Cobalt-Nickel heterostructure.

Figure 28:
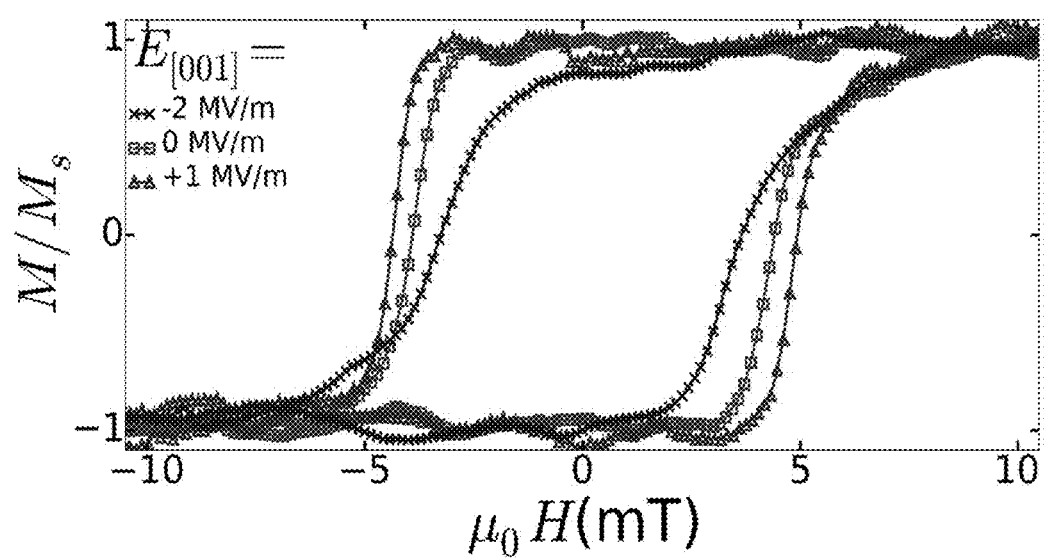
FIG. 28 shows a graph of magnetization strength (normalized to saturation magnetization strength) versus magnetic field for a magnetic piezoelectric composite.
Figure 29:
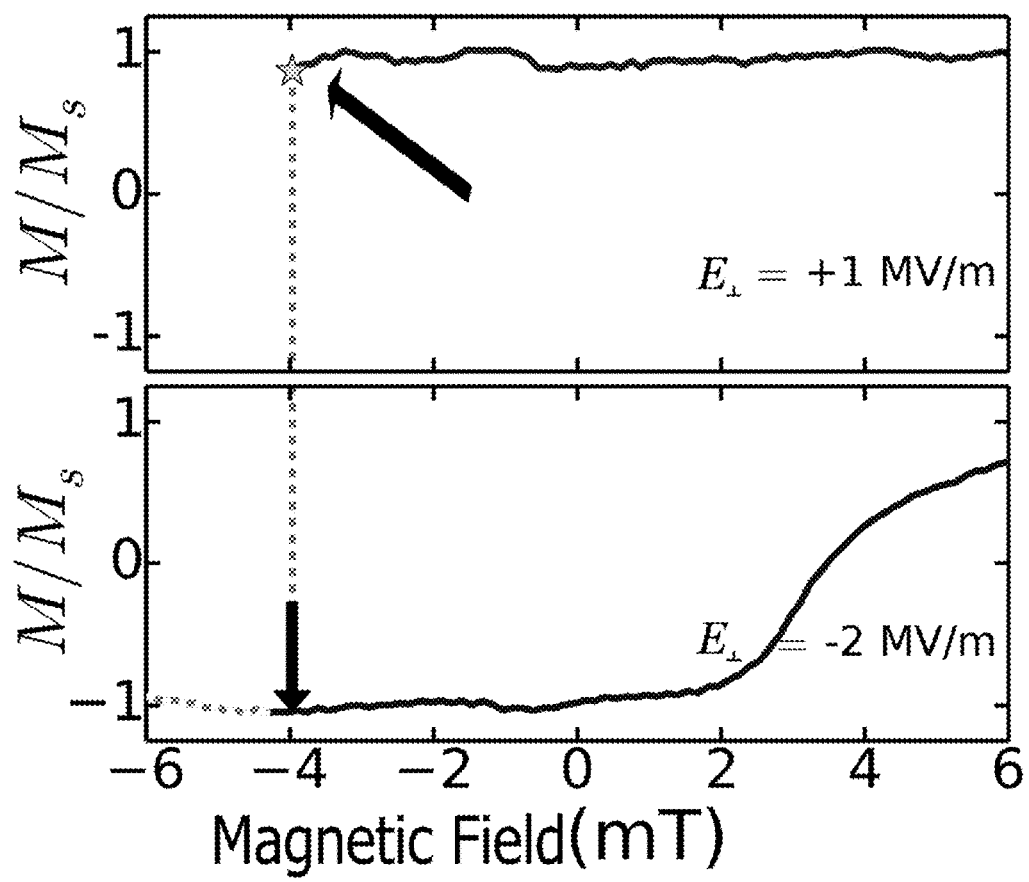
FIG. 29 shows a graph of magnetization strength (normalized to saturation magnetization strength) versus magnetic field in which electric-field assisted magnetization switching occurs for a magnetic piezoelectric memory.

Negative electric fields in the PZT piezoelectric layer can generate compressive-in-plane strains, which lower the magnetic coercive field and the perpendicular anisotropy field strength of the Cobalt-Nickel magnetic layer. A positive electric field can produce a compressive out-of-plane strain to enhance the magnetic coercive field and perpendicular anisotropy field strength of the Cobalt-Nickel magnetic layer. These two different regimes enable magnetization reversal of the Cobalt-Nickel magnetic layer in presence of a strain voltage applied to the PZT piezoelectric layer. FIG. 28 shows a graph of reduced (or normalized) magnetization versus applied perpendicular magnetic field in which major magnetic hysteresis loops (e.g. from magnetization pointing entirely "down" to magnetization pointing entirely "up" and back) are shown for three different electric fields in the PZT piezoelectric layer. Relative to the zero electric field data (e.g. marked by unshaded squares), a large, negative electric field (e.g. −2 MV/m) in the PZT reduces the magnetic coercive field and the perpendicular anisotropy field strength as can be seen by the data marked with 'x' markers. On the other hand, a large positive electric field (e.g. +1 MV/m) increases the magnetic coercive field and the perpendicular anisotropy strength. As mentioned previously, reconfiguring the magnetic coercive field and perpendicular anisotropy strength, as shown in FIG. 29, can be used to generate a reconfigurable magnetic field sensor by changing the sensitivity slope and saturation field dynamic range of a sensor with an applied bias to a piezoelectric layer in such an article. Relatedly, FIG. 29 shows that an out-of-plane bias magnetic field ($\mu_0 H_b = -4.2$ mT) is applied to a bimetallic member that includes a Co/Ni multilayer film that disposed on a piezoelectric layer that includes a PZT substrate. Starting with a +1 MV/m electric field bias after magnetic saturation in a large positive magnetic field the magnetization of the bimetallic member follows the solid line in the top subfigure extending from large positive field down to −4.2 mT and is terminated by a star. Subsequently, the electric bias is reduced from +1 MV/m to −2 MV/m, driving the Co/Ni film bimetallic member into the low coercivity operating region that is indicated by the arrow extending down from the star and into the bottom subfigure shown in FIG. 29. The Co/Ni film bimetallic member subsequently follows the remagnetization curve defined by the low coercivity state, represented by the solid curve in the bottom subfigure. This is an example of a magnetic strain-controlled magnetic memory of a magnetic piezoelectric memory 104) in which the non-volatility of the bimetallic member is combined with the voltage-controlled strains mediated by the piezoelectric layer for strain control.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. A magnetic piezoelectric composite to adjust magnetic anisotropy strength in a bimetallic member, the magnetic piezoelectric composite comprising:
    a piezoelectric layer to produce a strain in response to receipt of a strain voltage; and
    the bimetallic member disposed on the piezoelectric layer, the bimetallic member comprising:
        a plurality of metal layers, such that a second metal layer is interposed between a pair of first metal layers; and
        a magnetic anisotropy strength that changes in response to receipt of the strain from the piezoelectric layer, the bimetallic member being ferromagnetic.

2. The magnetic piezoelectric composite of claim 1, further comprising:
    a first anisotropy tuning layer interposed between the piezoelectric layer and the bimetallic member,
    the first anisotropy tuning layer providing a spatial preference of a magnetization of the bimetallic member in which the magnetization is perpendicular to an interface between the first anisotropy tuning layer and the bimetallic member in an absence of the strain from the piezoelectric layer.

3. The magnetic piezoelectric composite of claim 2, further comprising:
    a second anisotropy tuning layer disposed on the bimetallic member,
    the second anisotropy tuning layer, in combination with the first anisotropy tuning layer, providing the spatial preference of the magnetization of the bimetallic member perpendicular to the interface between the first anisotropy tuning layer and the bimetallic member in the absence of the strain from the piezoelectric layer.

4. The magnetic piezoelectric composite of claim 1, further comprising:
    an adhesion layer interposed between the piezoelectric layer and the bimetallic member.

5. The magnetic piezoelectric composite of claim 1, further comprising:
    a substrate on which the piezoelectric layer and the bimetallic member are disposed.

6. The magnetic piezoelectric composite of claim 1, wherein the first metal layer comprises cobalt, and
    the second metal layer comprises nickel.

7. A magnetic piezoelectric sensor comprising:
    a piezoelectric layer comprising:
        a strain surface; and
        a basal surface,
        the piezoelectric layer to produce a strain in response to receipt of a strain voltage;
    a first bimetallic member disposed on the strain surface of the piezoelectric layer to receive the strain from the piezoelectric layer, the first bimetallic member comprising:

a plurality of metal layers, such that a second metal layer is interposed between a pair of first metal layers; and
a magnetic anisotropy strength that changes in response to receipt of the strain from the piezoelectric layer, the bimetallic member being ferromagnetic;
a first electrically conductive layer on which the basal surface of the piezoelectric layer is disposed, such that the piezoelectric layer is interposed between the first electrically conductive layer and the first bimetallic member,
wherein the first electrically conductive layer selectively adjusts the magnetic anisotropy strength of the first bimetallic member,
a second bimetallic member disposed on the first bimetallic member to receive a second strain, the second bimetallic member comprising:
a second plurality of metal layers, such that a fourth metal layer is interposed between a pair of third metal layers; and
a second magnetic anisotropy strength that changes in response to receipt of the second strain,
the second bimetallic member being ferromagnetic;
a second anisotropy tuning layer interposed between the first bimetallic member and the second bimetallic member, the second anisotropy tuning layer to electrically insulate the first bimetallic member from the second bimetallic member or to promote spin-dependent tunneling from the first bimetallic member to the second bimetallic member; and
a first electrically conductive layer on which the strain surface of the piezoelectric layer is disposed, such that the piezoelectric layer is interposed between the first electrically conductive layer and the first bimetallic member, such that the first electrically conductive layer selectively adjusts the first magnetic anisotropy strength of the first bimetallic member.

8. The magnetic piezoelectric sensor of claim 7, further comprising:
a second electrically conductive layer disposed on the second bimetallic member distal to the second anisotropy tuning layer, such that the second bimetallic member is interposed between the second electrically conductive layer and the first bimetallic member,
wherein the second electrically conductive layer, in combination with the first bimetallic member, selectively adjusts the second magnetic anisotropy strength of the second bimetallic member.

9. The magnetic piezoelectric memory of claim 8, further comprising:
a magnetization pinning layer disposed on the second bimetallic member, such that the magnetization pinning layer is interposed between the second electrically conductive layer and the second bimetallic member,
wherein the magnetization pinning layer, in combination with the second anisotropy tuning layer, selectively pins the magnetization direction of the second bimetallic member perpendicular to the interface between the second bimetallic member and the magnetization pinning layer.

10. The magnetic piezoelectric sensor of claim 9, further comprising:
a second electrically conductive layer disposed on the bimetallic member distal to the piezoelectric layer, such that the bimetallic member is interposed between the piezoelectric layer and the second electrically conductive layer,
wherein the second electrically conductive layer, in combination with the first electrically conductive layer, selectively adjusts the magnetic anisotropy strength of the bimetallic member.

11. The magnetic piezoelectric sensor of claim 10, further comprising:
a first anisotropy tuning layer interposed between the piezoelectric layer and the bimetallic member,
the first anisotropy tuning layer providing a spatial preference of a magnetization of the bimetallic member in which the magnetization is perpendicular to an interface between the first anisotropy tuning layer and the bimetallic member in an absence of the strain from the piezoelectric layer.

12. The magnetic piezoelectric sensor of claim 11, further comprising:
a second anisotropy tuning layer interposed between the bimetallic member and the second electrical conductive layer,
the second anisotropy tuning layer, in combination with the first anisotropy tuning layer, providing the spatial preference of the magnetization of the bimetallic member perpendicular to the interface between the anisotropy tuning layer and the bimetallic member in the absence of the strain from the piezoelectric layer.

13. The magnetic piezoelectric sensor of claim 12, further comprising:
an adhesion layer interposed between the piezoelectric layer and the bimetallic member.

14. The magnetic piezoelectric sensor of claim 13, further comprising:
a substrate on which the piezoelectric layer and the bimetallic member are disposed.

15. The magnetic piezoelectric sensor of claim 12, wherein the first metal layer comprises cobalt, and
the second metal layer comprises nickel.

16. A magnetic piezoelectric memory comprising:
a piezoelectric layer comprising:
a strain surface; and
a basal surface,
the piezoelectric layer to produce a first strain in response to receipt of a first strain voltage;
a first bimetallic member disposed on the strain surface of the piezoelectric layer to receive the first strain from the piezoelectric layer, the first bimetallic member comprising:
a first plurality of metal layers, such that a second metal layer is interposed between a pair of first metal layers; and
a first magnetic anisotropy strength that changes in response to receipt of the first strain from the piezoelectric layer,
the first bimetallic member being ferromagnetic;
a second bimetallic member disposed on the first bimetallic member to receive a second strain, the second bimetallic member comprising:
a second plurality of metal layers, such that a fourth metal layer is interposed between a pair of third metal layers; and
a second magnetic anisotropy strength that changes in response to receipt of the second strain,
the second bimetallic member being ferromagnetic;
a second anisotropy tuning layer interposed between the first bimetallic member and the second bimetallic member, the second anisotropy tuning layer to electrically insulate the first bimetallic member from the second bimetallic member or to promote spin-dependent tunneling from the first bimetallic member to the second bimetallic member; and a first electrically conductive layer on which the strain surface of the piezoelectric layer is disposed, such that the piezoelectric layer is interposed between the first electrically conductive layer and the first bimetallic member, such that the first electrically conductive layer selectively adjusts the first magnetic anisotropy strength of the first bimetallic member.

17. The magnetic piezoelectric memory of claim 16, further comprising:

a second electrically conductive layer disposed on the second bimetallic member distal to the second anisotropy tuning layer, such that the second bimetallic member is interposed between the second electrically conductive layer and the first bimetallic member, wherein the second electrically conductive layer, in combination with the first bimetallic member, selectively adjusts the second magnetic anisotropy strength of the second bimetallic member.

18. The magnetic piezoelectric memory of claim 16, further comprising:

a magnetization pinning layer disposed on the second bimetallic member, such that the magnetization pinning layer is interposed between the second electrically conductive layer and the second bimetallic member, wherein the magnetization pinning layer, in combination with the second anisotropy tuning layer, selectively pins the magnetization direction of the second bimetallic member perpendicular to the interface between the second bimetallic member and the magnetization pinning layer.

19. The magnetic piezoelectric memory of claim 16, further comprising:

a first anisotropy tuning layer interposed between the piezoelectric layer and the first bimetallic member, the first anisotropy tuning layer providing a spatial preference of a magnetization of the first bimetallic member in which the magnetization is perpendicular to an interface between the first anisotropy tuning layer and the first bimetallic member in an absence of the first strain from the piezoelectric layer.

20. The magnetic piezoelectric memory of claim 19, wherein the second anisotropy tuning layer, in combination with the first anisotropy tuning layer, provide the spatial preference of the magnetization of the first bimetallic member perpendicular to the interface between the first anisotropy tuning layer and the first bimetallic member in the absence of the first strain from the piezoelectric layer.

21. The magnetic piezoelectric memory of claim 16, further comprising:

an adhesion layer interposed between the piezoelectric layer and the first bimetallic member.

22. The magnetic piezoelectric memory of claim 16, further comprising:

a substrate on which the piezoelectric layer and the first bimetallic member are disposed.

23. The magnetic piezoelectric memory of claim 16, wherein first metal layer comprises cobalt, and the second metal layer comprises nickel.

* * * * *